(12) United States Patent
Kawarada et al.

(10) Patent No.: US 10,845,323 B2
(45) Date of Patent: Nov. 24, 2020

(54) ION SENSOR, ION CONCENTRATION MEASUREMENT METHOD, AND ELECTRONIC COMPONENT

(71) Applicants: WASEDA UNIVERSITY, Tokyo (JP);
YOKOGAWA ELECTRIC CORPORATION, Tokyo (JP)

(72) Inventors: Hiroshi Kawarada, Tokyo (JP);
Masafumi Inaba, Tokyo (JP); Mohd Sukri Shaili Falina Binti, Tokyo (JP);
Takuro Naramura, Tokyo (JP);
Keisuke Igarashi, Tokyo (JP);
Yukihiro Shintani, Tokyo (JP); Kotaro Ogawa, Tokyo (JP)

(73) Assignees: WASEDA UNIVERSITY, Tokyo (JP);
YOKOGAWA ELECTRIC CORPORATION, Tokyo (JP)

(*) Notice: Subject to any disclaimer, the term of this patent is extended or adjusted under 35 U.S.C. 154(b) by 198 days.

(21) Appl. No.: 16/080,591

(22) PCT Filed: Mar. 2, 2017

(86) PCT No.: PCT/JP2017/008283
§ 371 (c)(1),
(2) Date: Aug. 28, 2018

(87) PCT Pub. No.: WO2017/150669
PCT Pub. Date: Sep. 8, 2017

(65) Prior Publication Data
US 2019/0049401 A1 Feb. 14, 2019

(30) Foreign Application Priority Data

Mar. 2, 2016 (JP) .................................. 2016-040360
Feb. 22, 2017 (JP) .................................. 2017-031504

(51) Int. Cl.
*G01N 27/414* (2006.01)
*G01N 27/30* (2006.01)
(Continued)

(52) U.S. Cl.
CPC ........... *G01N 27/301* (2013.01); *G01N 27/30* (2013.01); *G01N 27/302* (2013.01);
(Continued)

(58) Field of Classification Search
CPC ............. G01N 27/414; G01N 27/4145; G01N 27/4148; G01N 27/301; H01L 2924/13073; H01L 2924/15793
See application file for complete search history.

(56) References Cited

U.S. PATENT DOCUMENTS 4,641,249 A * 2/1987 Gion .................. G01N 27/4148
204/408
6,353,323 B1 * 3/2002 Fuggle ............... G01N 27/4148
324/425
(Continued)

FOREIGN PATENT DOCUMENTS

DE 19703357 A1 8/1998
JP S58-167952 A 10/1983
(Continued)

OTHER PUBLICATIONS

EPO machine-generated English language translation of the Description section Kohn et al. WO 01/61328 A2 (Year: 2001).*
(Continued)

*Primary Examiner* — Alexander S Noguerola
(74) *Attorney, Agent, or Firm* — Osha Bergman Watanabe & Burton LLP

(57) ABSTRACT

An electronic component includes a field effect transistor that functions as a working electrode of an ion sensor and a driving circuit that causes a potential difference between a
(Continued)

source electrode and a drain electrode of the field effect transistor. A reference electrode potential of the field effect transistor is fixed.

15 Claims, 17 Drawing Sheets

(51) Int. Cl.
  *G01N 27/333* (2006.01)
  *G01N 27/416* (2006.01)
(52) U.S. Cl.
  CPC ......... *G01N 27/308* (2013.01); *G01N 27/333* (2013.01); *G01N 27/414* (2013.01); *G01N 27/4148* (2013.01); *G01N 27/4161* (2013.01); *H01L 2924/13073* (2013.01)

(56) References Cited

U.S. PATENT DOCUMENTS

| | | | |
|---|---|---|---|
| 2006/0237313 A1* | 10/2006 | Kiesele | G01N 27/404 204/412 |
| 2012/0199884 A1 | 8/2012 | Shintani et al. | |
| 2016/0011186 A1 | 1/2016 | Oldham et al. | |

FOREIGN PATENT DOCUMENTS

| | | | | |
|---|---|---|---|---|
| JP | 2003-185617 A | 7/2003 | | |
| JP | 2004-109020 A | 4/2004 | | |
| JP | 2007-089511 A | 4/2007 | | |
| JP | 2012-163531 A | 8/2012 | | |
| JP | 2012-168120 A | 9/2012 | | |
| JP | 2013-525758 A | 6/2013 | | |
| JP | 2014-115078 A | 6/2014 | | |
| JP | 2014-513803 A | 6/2014 | | |
| WO | WO 01/61328 A2 * | 8/2001 | ............ | G01N 27/00 |
| WO | 2011/128423 A1 | 10/2011 | | |
| WO | 2012/156307 A1 | 11/2012 | | |

OTHER PUBLICATIONS

EPO machine-generated English language translation of the Description section of Sugino et al. JP 2003-185617 A (Year: 2003).*

Markus Dankerl et al.: "Diamond solution-gated field effect transistors: Properties and bioelectronic applications", Physica Status Solidi. A: Applications and Materials Science, vol. 209, No. 9, Aug. 10, 2012 (Aug. 10, 2012), pp. 1631-1642 (12 pages).

* cited by examiner

ION SENSOR, ION CONCENTRATION MEASUREMENT METHOD, AND ELECTRONIC COMPONENT

TECHNICAL FIELD

The present invention relates to an ion sensor, an ion concentration measurement method using an ion sensor, and an electronic component constituting the ion sensor.

Priority is claimed based on Japanese Patent Application No. 2016-040360 filed on Mar. 2, 2016 and Japanese Patent Application No. 2017-031504 filed on Feb. 22, 2017, the contents of which are incorporated herein by reference.

BACKGROUND

In recent years, sensor devices for detecting a particular substance included in a solution (electrolyte solution), such as, e.g., an ion sensor for detecting ion concentration in a solution and a biosensor for detecting an organic material such as protein and glucose in a solution, have been actively researched and developed. As one type of such sensor devices, there is a sensor device provided with a field effect transistor in which a source electrode and a drain electrode are formed on a diamond thin film, and a surface of the diamond thin film that is between the source electrode and the drain electrode and that is in contact with the solution functions as a channel. In such field effect transistor, the portion in contact with the solution is configured to be the diamond thin film, and therefore, such field effect transistor has an advantage in achieving a high stability, ease of manufacturing, and a low cost.

Patent Literature 1 discloses an ion sensor having the field effect transistor explained above. More specifically, Patent Literature 1 discloses the ion sensor that has a reference electrode and a working electrode arranged to sandwich a detection-target solution, wherein each of the reference electrode and the working electrode is constituted by the field effect transistor (p channel field effect transistor) explained above. Furthermore, Patent Literature 1 discloses that a surface of a diamond thin film that functions as a channel is applied with hydrogen termination treatment, and then, a portion thereof is oxygen-terminated or fluorine-terminated to control the ion sensitivity.

Patent Literature 2 also discloses an ion sensor having the field effect transistor explained above. More specifically, Patent Literature 2 discloses the ion sensor having a reference electrode constituted by the field effect transistor explained above and a working electrode constituted by a tubular glass electrode to be in contact with a detection-target solution arranged at the gate side thereof. In addition, Patent Literature 2 discloses that a surface of a diamond thin film that functions as a channel is applied with hydrogen termination treatment, and then, a portion thereof is oxygen-terminated or fluorine-terminated to control the ion sensitivity.

CITATION LIST

Patent Literature

[Patent Literature 1] Japanese Unexamined Patent Application Publication No. 2012-168120
[Patent Literature 2] Japanese Unexamined Patent Application Publication No. 2012-163531
[Patent Literature 3] Japanese Unexamined Patent Application Publication No. 2007-089511
[Patent Literature 4] Japanese Unexamined Patent Application Publication No. 2004-109020

In any of the ion sensors disclosed in Patent Literatures 1, 2, the sensor device is driven by a three-terminal device having gate, source, and drain, and therefore, a driving circuit and a driving method therefor becomes complicated, and as a result, the entire configuration as the ion sensor becomes complicated.

SUMMARY

One or more embodiments of the present invention provide an ion sensor in which a potential of the reference electrode (gate electrode) is fixed, and the driving circuit, the driving method, and the entire configuration are simplified, and provide a measurement method of an ion concentration using the ion sensor and an electronic component constituting the ion sensor.

An electronic component according to one or more embodiments of the present invention includes a field effect transistor constituting (i.e., functioning as) a working electrode of an ion sensor and a driving circuit causing a potential difference between a source electrode and a drain electrode of the field effect transistor, wherein a potential of a reference electrode (gate electrode) of the field effect transistor is fixed.

In the electronic component according to one or more embodiments of the present invention, a diamond thin film may be formed on one of main surfaces of a substrate of the field effect transistor, and the source electrode and the drain electrode may be formed on the diamond thin film.

The electronic component according to one or more embodiments of the present invention may further include a conductive diamond electrode, wherein the reference electrode potential may be fixed by the conductive diamond electrode.

In the electronic component according to one or more embodiments of the present invention, a surface of the diamond electrode may be fluorine-terminated.

In the electronic component according to one or more embodiments of the present invention, the field effect transistor constituting the working electrode may be an Ion-Sensitive Field-Effect Transistor.

An ion sensor according to one or more embodiments of the present invention is an ion sensor for measuring ion concentration of a measurement target liquid, based on an output from a reference electrode and a working electrode, and including a field effect transistor functioning as the working electrode, a metal container containing the field effect transistor and the measurement target liquid, and being fixed at a predetermined potential and functioning as the reference electrode (gate electrode), and a driving circuit causing a potential difference between a source electrode and a drain electrode of the field effect transistor.

In the ion sensor according to one or more embodiments of the present invention, a diamond thin film may be formed on one of main surfaces of a substrate of the field effect transistor, the source electrode and the drain electrode may be formed on the diamond thin film.

In the ion sensor according to one or more embodiments of the present invention, a protective film may be formed on a surface of the source electrode and the drain electrode of the field effect transistor.

In the ion sensor according to one or more embodiments of the present invention, vicinity of a surface of the diamond thin film may be made into p-type semiconductor.

In the ion sensor according to one or more embodiments of the present invention, an Ion-Sensitive Field-Effect Transistor is used as the field effect transistor functioning as the working electrode.

In the ion sensor according to one or more embodiments of the present invention, the substrate constituting the Ion-Sensitive Field-Effect Transistor may be a silicon substrate.

In the ion sensor according to one or more embodiments of the present invention, a diamond thin film may be formed on a main surface at a channel side of the silicon substrate.

In the ion sensor according to one or more embodiments of the present invention, an inner wall surface of the metal container may be coated with a conductive material.

In the ion sensor according to one or more embodiments of the present invention, the conductive material may be made of at least one of metal, carbon, conductive diamond, and conductive diamond-like carbon.

In the ion sensor according to one or more embodiments of the present invention, the metal container may be constituted by an insulating container and a conductive film made of a conductive material coated on an inner wall surface of the insulating container.

An ion concentration measurement method according to one or more embodiments of the present invention is an ion concentration measurement method using the ion sensor, and including immersing the field effect transistor in a measurement target liquid contained in the metal container, generating a current between a source area and a drain area of the field effect transistor by electrochemically connecting a channel area of the field effect transistor to the metal container via the measurement target liquid and by using the driving circuit, while a potential difference is caused between the source area and the drain area of the field effect transistor, and measuring ion concentration in the measurement target liquid, based on the current.

In the ion concentration measurement method according to one or more embodiments of the present invention, a voltage applied to the drain area may be 0V.

In the ion sensor according to one or more embodiments of the present invention, when the ion concentration of the measurement target solution contained in the metal container is measured, the gate area of the working electrode is electrochemically connected to the metal container via the measurement target liquid, and the potential thereof is fixed. Therefore, unlike a conventional ion sensor, there is no need to use a separate reference electrode, and a stable current can be passed between the source and the drain just by controlling the voltage of the source area or the drain area, and based on the characteristic of this current, the ion concentration of the measurement target liquid can be accurately measured. As described above, the ion sensor according to one or more embodiments of the present invention does not use the reference electrode, and accordingly, has a simplified configuration as compared with conventional ion sensors, and the driving circuit and the driving method are also simplified. When the ion sensor according to one or more embodiments of the present invention is used, the measurement of the ion concentration of the measurement target liquid can be done in a simple procedure by just immersing the ion sensor in the measurement target liquid contained in the metal container and setting a potential difference between the source and the drain.

Since the ion sensor according to one or more embodiments of the present invention is configured such that the reference electrode (gate electrode) of the field effect transistor is grounded, a saturated current value can be obtained at $Vdg=0[V]$ as explained later as an example Therefore, when the ion sensor according to one or more embodiments of the present invention is used, the ion concentration can be measured with a simple procedure simply by grounding the two terminals, i.e., the metal container corresponding to the gate electrode and the drain electrode, and changing the potential of the source electrode. In this case, it is possible to avoid the application of the gate voltage which leads to the deterioration of the field effect transistor, which occurred with conventional source-grounded circuits.

In addition, it is unnecessary to have a complicated configuration that measures the gate voltage by controlling the source-drain voltage and the source-drain current as is done in the conventional source follower circuit.

In the ion sensor according to the present embodiment, the reference electrode is not used, and therefore, it is possible to avoid contamination and deterioration over time due to leakage of internal liquid at the reference electrode which occurred in conventional glass electrode-type ion sensors.

By immersing the electronic component in a measurement target liquid contained in an arbitrary container, the electronic component according to one or more embodiments of the present invention can perform the ion concentration measurement similar to that of the ion sensor can be performed. Furthermore, since the container of the electronic component according to the present embodiment is not limited, one or more embodiments of the present invention can be applied when measuring ion concentration of a measurement target liquid in a state where the measurement target liquid is contained in a predetermined container, such as a container to be actually used.

DETAILED DESCRIPTION

Figure 1:
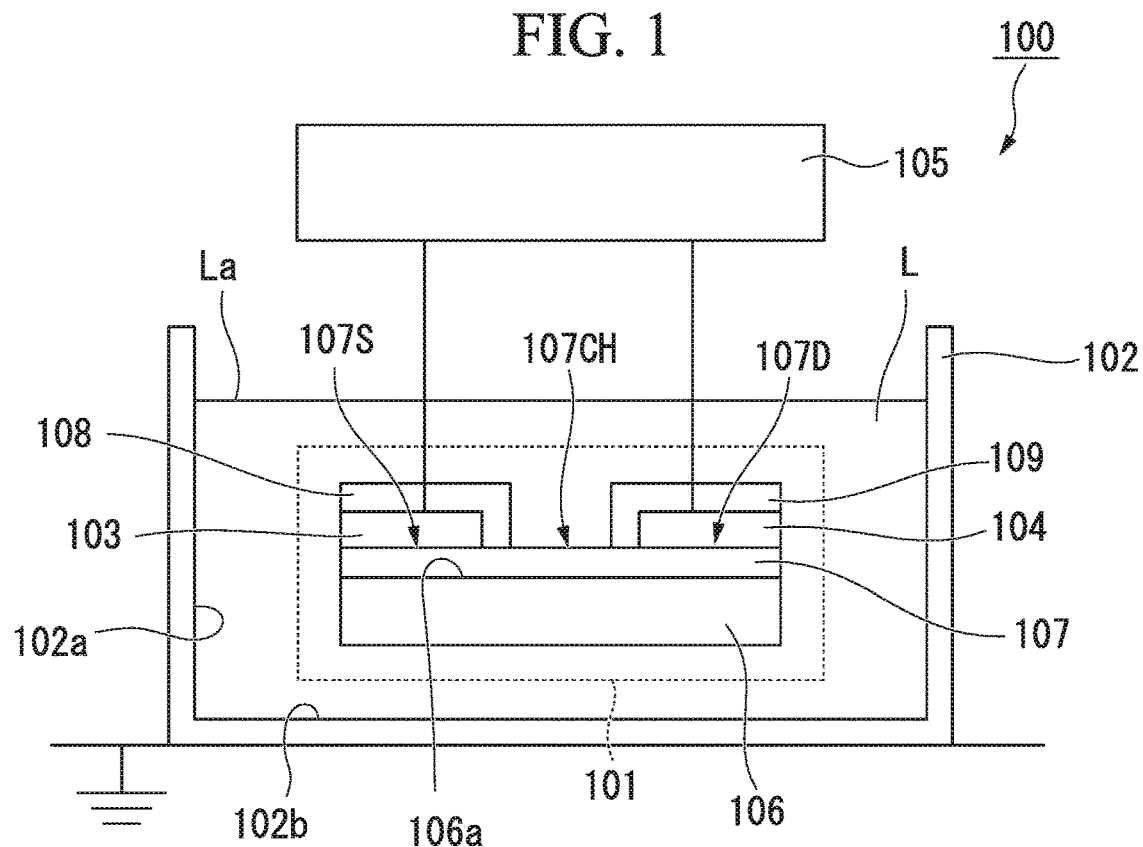
FIG. 1 is a cross sectional view illustrating an ion sensor according to a first embodiment of the present invention.

Hereinafter, an ion sensor, an ion concentration measurement method, and an electronic component according to embodiments of the present invention will be described in detail by using drawings and with reference to drawings. It should be noted that, in the drawings used in the following description, portions constituting features may be shown in an enlarged manner for the sake of convenience in order to facilitate understanding of the features, and the dimensional ratio of each component is not necessarily the same as the actual dimensions. In addition, the materials, dimensions, and the like exemplified in the following description are mere examples, and the present invention is not limited thereto, and it is possible to implement the present invention by appropriately making changes within a range not changing the gist thereof.

First Embodiment (Ion Sensor)

Figure 2:
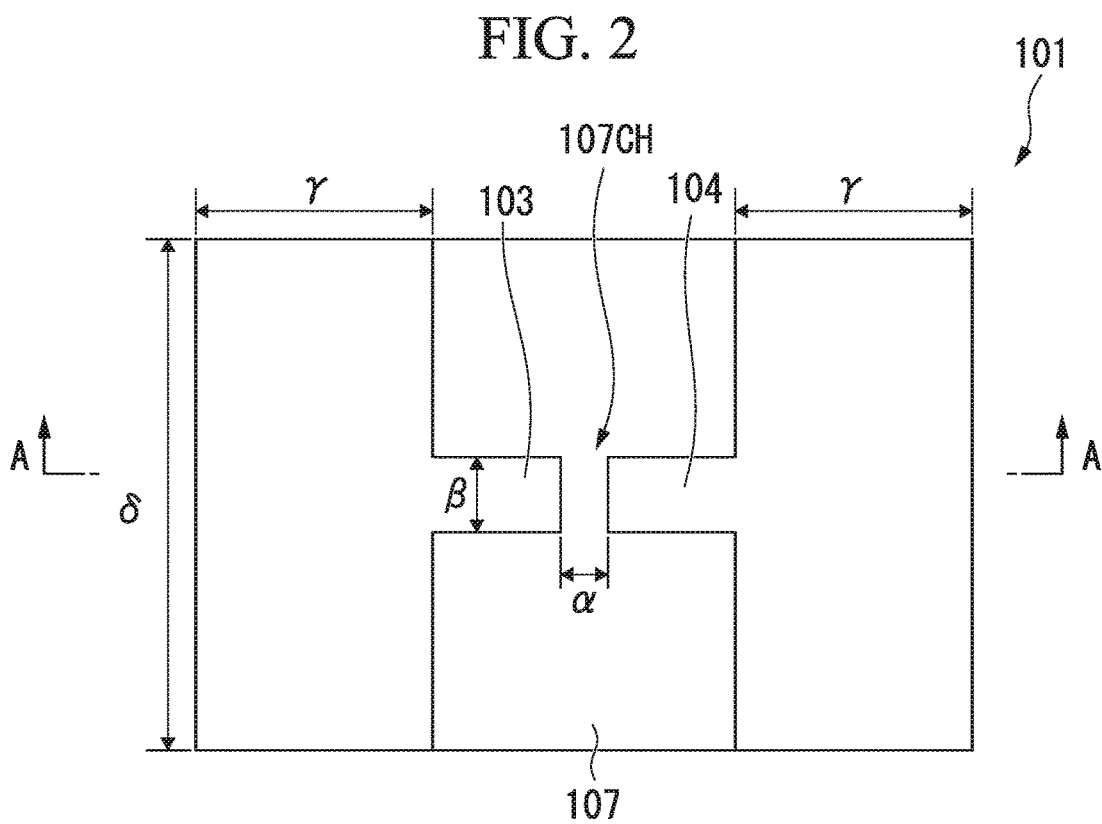
FIG. 2 is a top view illustrating a field effect transistor according to the first embodiment of the present invention.

FIG. 1 is a cross sectional view illustrating an ion sensor 100 according to the first embodiment of the present invention. FIG. 2 is a top view illustrating, as seen from the gate side, the field effect transistor 101 of p channel type constituting the ion sensor 100 of FIG. 1. The cross section of the field effect transistor 101 in FIG. 1 corresponds to the cross section taken along the line A-A of the field effect transistor 101 shown in FIG. 2. The ion sensor 100 measures ion concentration of a measurement target liquid L based on the output from a sensor device that acts as a working electrode. The configuration of the ion sensor 100 will be described with reference to FIGS. 1 and 2.

The ion sensor 100 includes a field effect transistor 101 constituting the working electrode, a metal container 102 containing the field effect transistor 101 and the measurement target liquid L, and a driving circuit (driving means) 105 giving potential difference between the source electrode 103 and the drain electrode 104 of the field effect transistor 101.

The field effect transistor 101 includes a silicon substrate 106, a diamond thin film 107 formed on one of the main surfaces 106a which is one side of the silicon substrate 106, the source electrode 103 and the drain electrode 104 formed on the diamond thin film 107, a protective film 108 covering a surface of the source electrode 103, and a protective film 109 covering a surface of the drain electrode 104.

On the surface of the diamond thin film 107, the source electrode 103 is provided on one side (source area) 107S, and the drain electrode 104 is provided on the other side (drain area) 107D, with a portion (channel area) 107CH functioning as the working electrode interposed therebetween.

The protective films 108 and 109 are provided to prevent the measurement target liquid from coming into contact with each electrode when the field effect transistor 101 is immersed in the measurement target liquid. In one or more embodiments, the protective films 108 and 109 are made of, for example, an oxide (glass, Pyrex (registered trademark), nitrides (silicon nitride or the like), a resist, or an organic matter (fluoride resin or the like such as Teflon (registered trademark)). In one or more embodiments, the thickness of the protective film is 0.1 μm or more and 1 mm or less.

Since the measurement target liquid L is introduced to the channel area 107CH, the field effect transistor 101 is called an Ion-Sensitive Field-Effect Transistor (ISFET). It should be noted that, since this Ion-Sensitive Field-Effect Transistor has a diamond thin film 107, the surface potential is stable, the Ion-Sensitive Field-Effect Transistor can be used under high temperature and high pressure environment, and is also referred to as a diamond ISFET. In addition, the field effect transistor 101 has the diamond thin film 107 but does not have any oxide in the liquid contact portion of the diamond thin film 107, it is also referred to as the diamond electrolyte Solution-Gate FET (SGFET).

The size of channel area 107CH is appropriately set according to characteristic of the ion sensor. For example, as shown in FIG. 2, the channel length α is set to a value of about 10 to 1000 μm, and the channel width β is set to a value of about 0.01 to 50 mm. On the other hand, the length γ of the source electrode 103 and the drain electrode 104 is set to a value of about 0.01 to 50 mm, and the width δ of the source electrode 103 and the drain electrode 104 is set to a value of about 0.01 to 100 mm.

Further, in one or more embodiments of the case of pH value measurement, the vicinity of the surface (area functioning as a channel) of the diamond thin film 107 functioning as the channel 107CH is made into p-type semiconductor by means of partial oxygen termination treatment, partial amino termination treatment, and the like. More specifically, the termination element is controlled to attain pH sensitivity within a range in which the hydrogen ion concentration is $1.0 \times 10^{-1}$ to $1.0 \times 10^{-14}$ mol/L. In other words, as the sensor device for pH value measurement, the surface of the diamond thin film 107 functioning as the gate is made into ion-sensitive termination. Examples of ion-sensitive termination include partial oxygen termination, partial amino termination, and the like, which have a sensitivity of 15 to 60 mV/pH.

The field effect transistor 101 can be formed through, mainly, a step of forming the source electrode 103 and the drain electrode 104 (electrode formation step) and a step of forming the protective films 108, 109 covering the source electrode 103 and the drain electrode 104, respectively (protective film formation step).

In the electrode formation step, first, a resist is spin-coated on one of the main surfaces 106a of the silicon substrate 106, and the resist pattern is formed through exposure and development. Thereafter, Au/Ti is sputtered, and liftoff is performed. As a result, the Au/Ti thin film having a plan view shape shown in FIG. 2 is formed on one of the main surfaces 106a of the silicon substrate. In this way, the source electrode 103 and the drain electrode 104 are formed on the silicon substrate 106.

In the protective film formation step, a resist serving as the protective films 108, 109 is spin-coated on the silicon substrate 106 on which the diamond thin film 107 and the Au/Tin film are formed, and the resist is patterned through exposure and development. In the area from which the resist is removed, the diamond thin film 107 is exposed. The area 107CH in which the diamond thin film 107 is exposed functions as the channel.

The metal container 102 is assumed to have a shape having such a volume that when the field effect transistor 101 is immersed in the contained measurement target liquid L, the field effect transistor 101 is away from the liquid surface La of the measurement target liquid and away from the side surface 102a and the bottom surface 102b of the metal container 102.

From the viewpoint of stabilizing the potential as the reference electrode, in one or more embodiments, the inner wall surface of the metal container 102 is coated with a conductive material. In one or more embodiments, the conductive material is made of at least one of metal, carbon, conductive diamond, and conductive diamond-like carbon.

The metal container 102 may be composed of only of metal, or may be composed of an insulating container and a conductive film composed of a conductive material coated on an inner wall surface (liquid-contact surface) thereof.

Figure 3A:
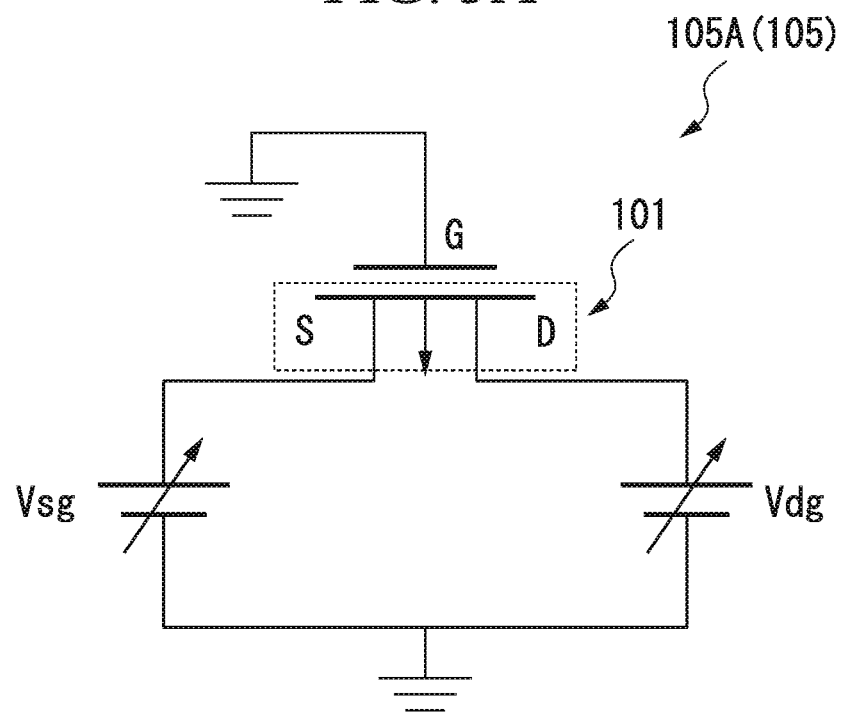
FIG. 3A is an example of a circuit for operating the ion sensor according to the first embodiment of the present invention.
Figure 3B:
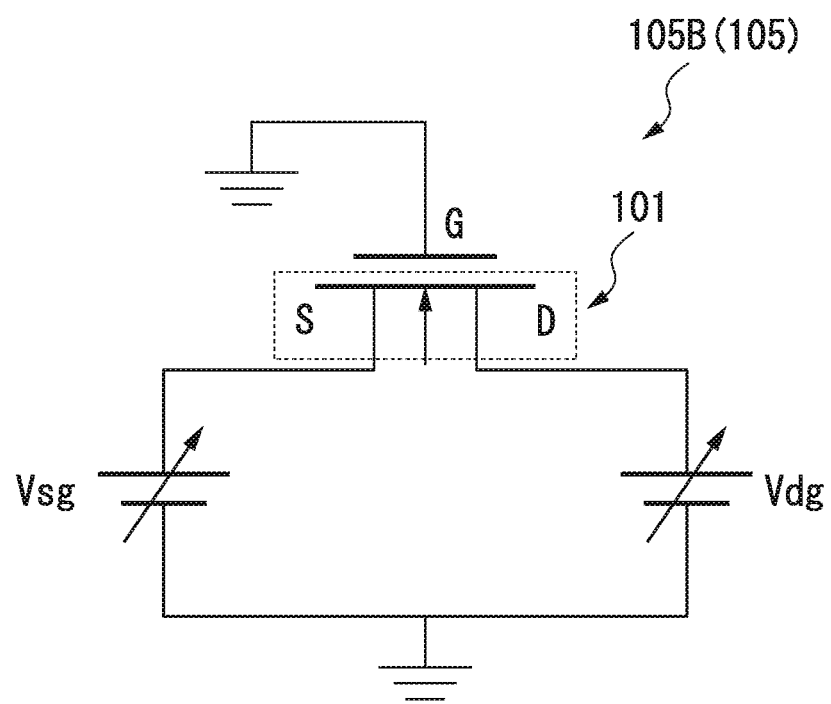
FIG. 3B is an example of a circuit for operating the ion sensor according to the first embodiment of the present invention.

The circuit 105 (105a, 105b) driving the field effect transistor 101 is a gate ground circuit using the field effect transistor 101 of p channel type or n-channel type. For example, as shown in FIG. 3A, FIG. 3B, the circuit 105 (105a, 105b) is a circuit with fixed gate potential (reference electrode potential).

(Ion Concentration Measurement Method)

A method for measuring the ion concentration in the measurement target liquid L will be described using the ion sensor 100 explained above.

First, the measurement target liquid L is contained in the electrically grounded metal container 102, and the field effect transistor 101 is immersed in the measurement target liquid L. At that time, the field effect transistor 101 in the measurement target liquid L is fixed at a position away from the liquid surface La of the measurement target liquid and away from the side surface 102a and the bottom surface 102b of the metal container. Although the fixing method is not limited, for example, the field effect transistor 101 can be fixed in a stable state by placing a support base made of an insulating member at the center of the bottom surface 102b and placing the field effect transistor 101 on the support surface.

With such configuration, the channel area 107CH of the field effect transistor is electrochemically connected to the metal container 102 via the measurement target liquid L, and the potential of the channel area 107CH is set. Due to the effect of this potential, holes are formed in an area inside the channel area 107CH.

The potential of the channel area changes according to the number of ions (ion concentration) attached to the channel surface. This is because the density of carriers induced in the channel area varies depending on the charge amount distributed in the vicinity of the gate surface. The higher the ion concentration of the measurement target liquid L is, the greater the number of ions attached to the channel surface is. As a result, the carrier density in the channel area inside the channel area increases, and the potential of the channel area increases according to the increase. Conversely, the lower the ion concentration of the measurement target liquid L is, the lower the carrier density is, and the potential of the channel area decreases according to the decrease. In other words, the potential of the channel area 107CH is fixed to the potential obtained by adding the contribution of the potential variation caused by the ion concentration to the potential (gate electrode potential) of the metal container.

Next, by using the driving circuit 105, a voltage is applied to one or both of the source electrode 103 and the drain electrode 104, so that a potential difference occurs between the source area 107S and the drain area 107D of the field effect transistor (between the source and the drain). In one or more embodiments, the potential difference between the source and the drain is set to −1 V or more and 1 V or less. It should be noted that the voltage application to the source electrode 103 and the drain electrode 104 may be performed before the field effect transistor 101 is immersed in the measurement target liquid L.

When a potential difference Vds is set between the source and the drain in the state where the channel is formed, a current Ids flows in the channel. Here, the current Ids has an IV characteristic as obtained by an ordinary field effect transistor 101 as described later as an example.

As mentioned above, the carrier density in the channel depends on the ion concentration in the measurement target liquid. The current Ids flowing when the specific voltage Vds is applied tends to increase when the ion concentration in the measurement target liquid is increased, and decrease when the ion concentration in the measurement target liquid is decreased, because the current Ids depends on this carrier density. In addition, as the carrier density increases, the formation of the channel is promoted, so the voltage Vsg required to obtain the specific current Ids tends to decrease when the ion concentration in the measurement target liquid is increased, and increase when the ion concentration in the measurement target liquid is decreased. As described above, the ion concentration in the measurement target liquid has correlation with the current Ids and the voltage Vsg, so the ion concentration in the measurement target liquid can be measured based on the IV characteristic of the field effect transistor 101.

In the ion sensor according to the present embodiment, when measuring the ion concentration of the measurement target solution contained in the metal container, the channel area of the working electrode is electrochemically connected to the metal container via the measurement target liquid, and the potential is fixed. Therefore, it is unnecessary to use a separate reference electrode unlike the conventional ion sensor, and a stable current can be caused to flow between source and drain only by controlling the voltage of the source area or the drain area, and the ion concentration of the measurement target liquid can be accurately measured based on the characteristic of this current. As described above, the ion sensor according to the present embodiment does not use the reference electrode, and therefore, the ion sensor according to the present embodiment has a simplified structure compared with conventional ion sensors, and the driving circuit and the driving method are also simplified.

Since the ion sensor according to the present embodiment is configured so that the gate portion of the field effect transistor is grounded, a saturated current value can be obtained at Vdg=0 [V] as described later as an example Therefore, when using the ion sensor according to the present embodiment, the ion concentration can be measured with a simple procedure simply by grounding the two terminals, i.e., the metal container corresponding to the gate electrode and the drain electrode, and changing the potential of the source electrode. In this case, it is possible to avoid the application of the gate voltage which leads to the deterioration of the field effect transistor, which occurred with conventional source-grounded circuits.

In addition, it is unnecessary to have a complicated configuration that measures the gate voltage by controlling the source-drain voltage and the source-drain current as is done in the conventional source follower circuit.

In the ion sensor according to the present embodiment, the reference electrode is not used, and therefore, it is possible to avoid problems such as contamination and deterioration over time due to leakage of internal liquid at the reference electrode which occurred in conventional glass electrode-type ion sensors.

In the ion concentration measurement method according to the present embodiment, the ion sensor described above is used, so that the measurement of the ion concentration of the measurement target liquid can be done in a simple procedure by just immersing the ion sensor in the measurement target liquid contained in the metal container and setting a potential difference between the source and the drain.

Figure 4:
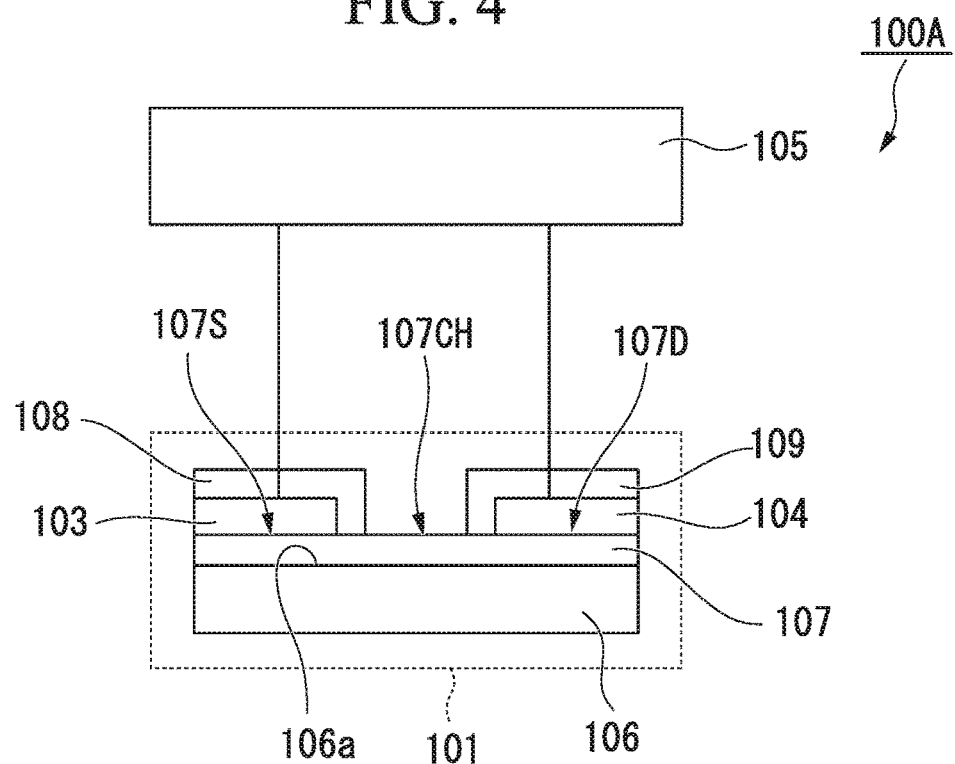
FIG. 4 is a cross sectional view illustrating an electronic component according to the first embodiment of the present invention.

FIG. 4 is a cross sectional view illustrating an electronic component 100A composed of the field effect transistor 101 and the driving circuit 105 in the ion sensor 100 according to the present embodiment. By immersing the electronic component 100A in a measurement target liquid contained in an arbitrary container, the ion concentration measurement similar to that of the ion sensor can be performed. Furthermore, since the container of the electronic component according to the present embodiment is not limited, the present embodiment can be applied when measuring ion concentration of a measurement target liquid in a state where the measurement target liquid is contained in a predetermined container, such as a container to be actually used. For example, when a metal food production pot is used as a pseudo reference electrode (gate electrode) in a production step of food etc., a configuration equivalent to that of the ion sensor according to the present embodiment can be obtained, and the ion concentration of the measurement target liquid contained in the pot can be measured just by placing the electronic component inside the metal food production pot.

Second Embodiment

Figure 5:
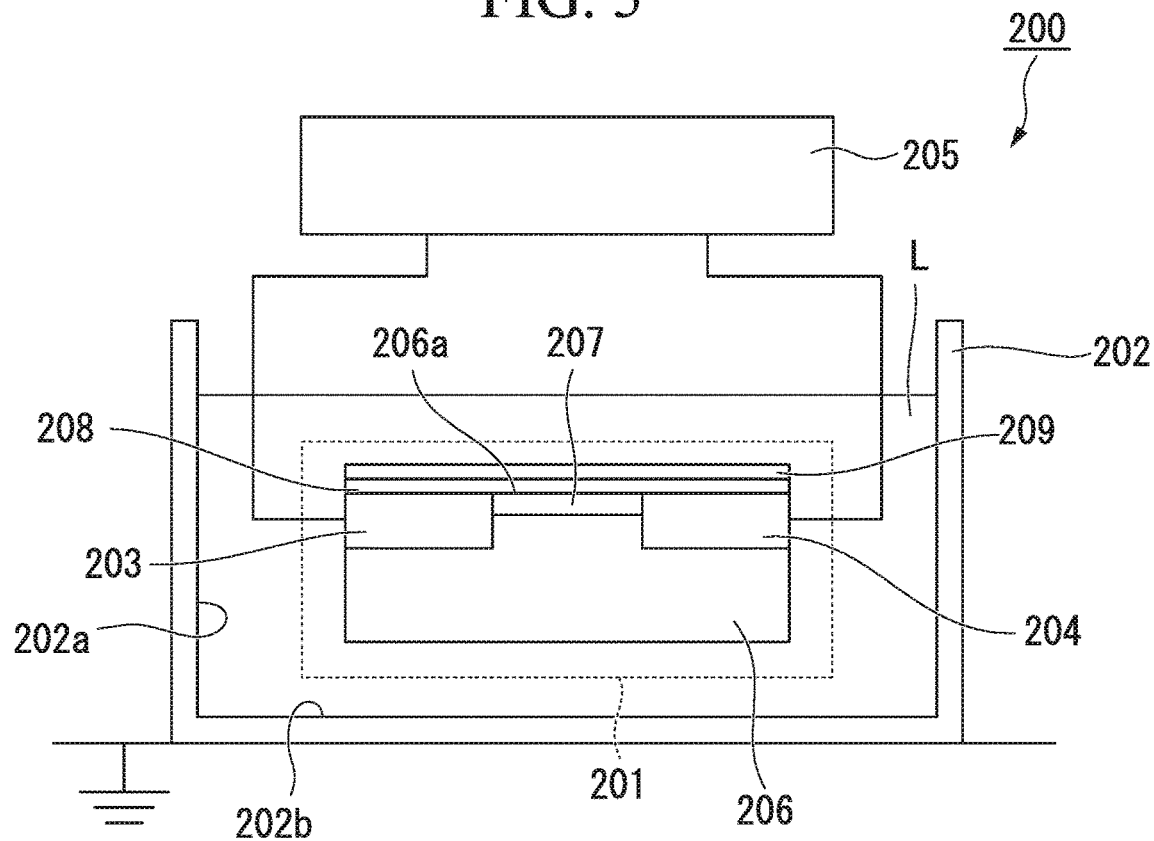
FIG. 5 is a cross sectional view illustrating an ion sensor according to a second embodiment of the present invention.

FIG. 5 is a cross sectional view illustrating an ion sensor 200 according to the second embodiment of the present invention. This ion sensor 200 also measures ion concentration of a measurement target liquid L on the basis of an output from a sensor device. However, the ion sensor 200 is different from the ion sensor 100 according to the first embodiment in that, in a field effect transistor functioning as a working electrode, an oxide film 208 and an ion-sensitive film 209 are sequentially provided on the silicon substrate 206 instead of the diamond thin film, and in that a source electrode (source area) 203 and a drain electrode (drain area) 204 are provided inside of the silicon substrate 206.

As illustrated in FIG. 5, the ion sensor 200 is configured such that, on one of main surfaces 206a of the silicon substrate, the source area 203 is provided at one end side and the drain area 204 is provided at the other end side, and a channel area 207 is provided therebetween. A driving circuit 205 is electrochemically connected to the source area 203 and the drain area 204. The oxide film 208 is a film that prevents the source area 203, the drain area 204, and the channel area 207 from conducting through the measurement target liquid L. The ion-sensitive film 209 is a film having a function of generating a voltage on the surface of the channel 207 by interaction with a particular ion in the measurement target liquid L when the ion-sensitive film 209 is comes into contact with the measurement target liquid L.

According to the ion sensor 200 of the present embodiment, in addition to the effect obtained by the ion sensor 100 according to the first embodiment, an effect related to selection of the conductivity type of the channel as described below is obtained. Since the field effect transistor constituting the ion sensor according to the first embodiment is a p channel type, it is said that the ion serving as the measurement target, in one or more embodiments, is an ion of a conductivity type which induces holes in the channel, i.e., negative ion. On the other hand, the field effect transistor constituting the ion sensor according to the present embodiment can be either p channel type or n channel type by impurity implantation. Therefore, the ion sensor according to the present embodiment can be applied regardless of whether the ion to be measured is positive ion or negative ion.

Third Embodiment

Figure 6:
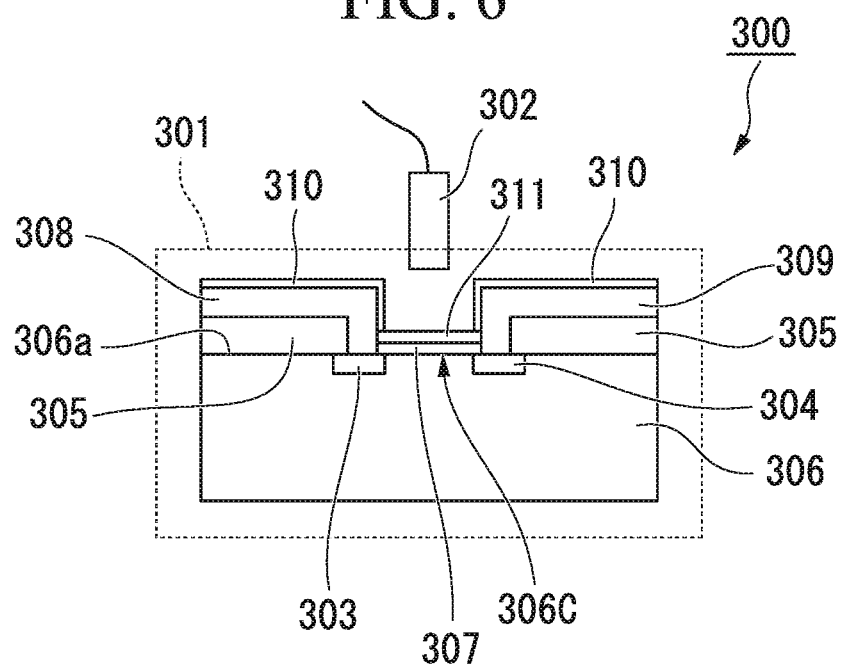
FIG. 6 is a cross sectional view illustrating an ion sensor according to a third embodiment of the present invention.

FIG. 6 is a cross sectional view illustrating an ion sensor 300 according to the third embodiment of the present invention. The ion sensor 300 includes a field effect transistor 301 as a working electrode and a metal electrode 302 as a reference electrode.

The field effect transistor type sensor 301 is composed of a p-type silicon substrate 306 and a laminated film formed on one of the main surfaces thereof 306a. In the p-type silicon substrate 306, two n+ layers are formed apart from each other on the one of main surfaces 306a. The two n+ layers respectively function as a source area 303 and a drain area 304.

The area sandwiched between the source area 303 and the drain area 304 is a channel area 306C functioning as a channel when the field effect transistor type sensor 301 is operated as a transistor. The size of the channel area 306C is appropriately set according to the characteristic of the ion sensor. For example, the channel length is set to a value of about 10 to 1000 µm and the channel width is set to a value of about 0.01 to 50 mm.

An ion-sensitive film 311 is formed on the channel area 306C, with a gate oxide film 307 made of $SiO_2$ interposed therebetween. Examples of materials of the ion-sensitive film 311 include $Ta_2O_5$, $Si_3N_4$, $Al_2O$ and the like. A field oxide film 305 made of $SiO_2$ is formed on the inactive area except for the channel area 306C, the source area 303, and the drain area 304 of the one of main surfaces 306a of the p-type silicon substrate.

A source electrode 308 and a drain electrode 309 are formed on the source area 303 and the drain area 304, respectively. The source electrode 308 and the drain electrode 309 are connected to the source area 303 and the drain area 304, respectively, and have a shape covering the surface of the field oxide film 305. Examples of materials of the source electrode 308 and the drain electrode 309 include gold, titanium and the like.

A protective film 310 is formed on an exposed portion of the surface of the source electrode 308 and the drain electrode 309. Examples of materials of the protective film 310 include nitrides (such as silicon nitride), resist, organic matters (fluorinated resins such as Teflon (registered trademark)), and oxides (glass, Pyrex (registered trademark), etc.).

A conductive material such as metal, i.e., platinum, gold, silver, stainless steel, iron, or the like, or carbon material or the like can be used for the metal electrode 302 functioning as the reference electrode, that is, the metal electrode 302 fixing the reference electrode potential. The electrode material used as the reference electrode is desired to have low reactivity to the component contained in the measurement target solution, i.e., chemical stability, and is desired to have stability under high temperature, low temperature, high pressure, low pressure, i.e., environmental resistance, and furthermore, the electrode material used as the reference electrode is desired to be less likely to cause physical adsorption and chemical adsorption to the surface. From this viewpoint, in one or more embodiments, conductive diamond is the material used for the reference electrode.

In one or more embodiments where a conductive diamond having a conductivity close to metal is used as a material of the metal electrode, a small amount of impurity is doped into the conductive diamond electrode. By doping impurity, desirable property as the electrode is obtained. Examples of impurities to be doped include boron (B), sulfur (S), nitrogen (N), oxygen (O), and silicon (Si). For example, in order to obtain boron, rimethoxyborane is used with a source gas containing a carbon source, but alternatively, diborane, boron oxide, or boron trimethoxide may be used. In order to obtain sulfur, sulfur oxide and hydrogen sulfide can be added. In order to obtain oxygen, oxygen or carbon dioxide can be added. In order to obtain nitrogen, ammonia or nitrogen can be added. In order to obtain silicon, silane or the like can be added. A plurality of impurities may be mixed.

In particular, in one or more embodiments, the metal electrode 302 made of conductive diamond doped with boron at a high concentration is used as a reference electrode because it has an advantageous property such as a wide potential window and a low background current as compared with other electrode materials. In the case where conductive diamond is used as the material of the metal electrode, examples of base materials include not only Si (monocrystalline, polycrystalline) but also Nb, Ta, Zr, Ti, Mo, W, graphite, and various kinds of carbides, which can be selected depending on purposes.

It should be noted that in one or more embodiments when the surface of the conductive diamond electrode is fluorine-terminated (partially fluorine-terminated), the stability of the reference electrode potential with respect to pH fluctuation increases.

Polycrystalline diamond and monocrystalline diamond can be used for the conductive diamond as the material of the metal electrode 302. Highly oriented polycrystalline diamond may also be used. For example, a (110) highly oriented polycrystalline diamond electrode can also be used. The highly oriented polycrystalline diamond is used in one or more embodiments because it has a more uniform crystal orientation than polycrystalline diamond, and as a result, it improves potential stability when used as a reference electrode.

Even in the ion sensor 300 according to the present embodiment, the same effects as those of the ion sensor 300 according to the first embodiment can be obtained.

Fourth Embodiment

Figure 7:
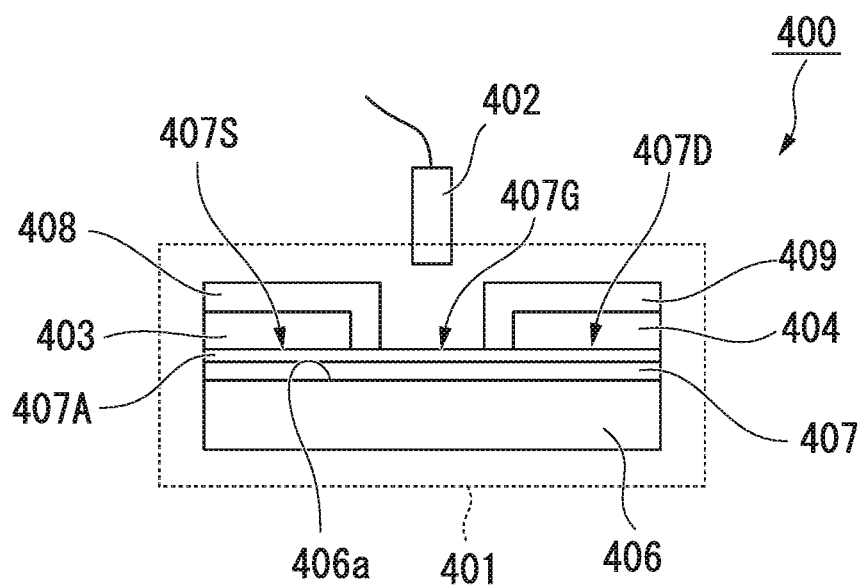
FIG. 7 is a cross sectional view illustrating an ion sensor according to a fourth embodiment of the present invention.

FIG. 7 is a cross sectional view illustrating an ion sensor 400 according to the third embodiment of the present invention. The ion sensor 400 has a field effect transistor 401 as a working electrode and a metal electrode 402 as a reference electrode. The field effect transistor 401 has a configuration in which a boron doped layer (BDD layer) 407A is formed on the surface of the diamond thin film in the field effect transistor 101 according to the first embodiment, and the metal electrode 402 is made of Ag/AgCl. Even in the ion sensor 400 of the present embodiment, the same effect as the ion sensor 100 according to the first embodiment can be obtained.

Fifth Embodiment

Figure 8:
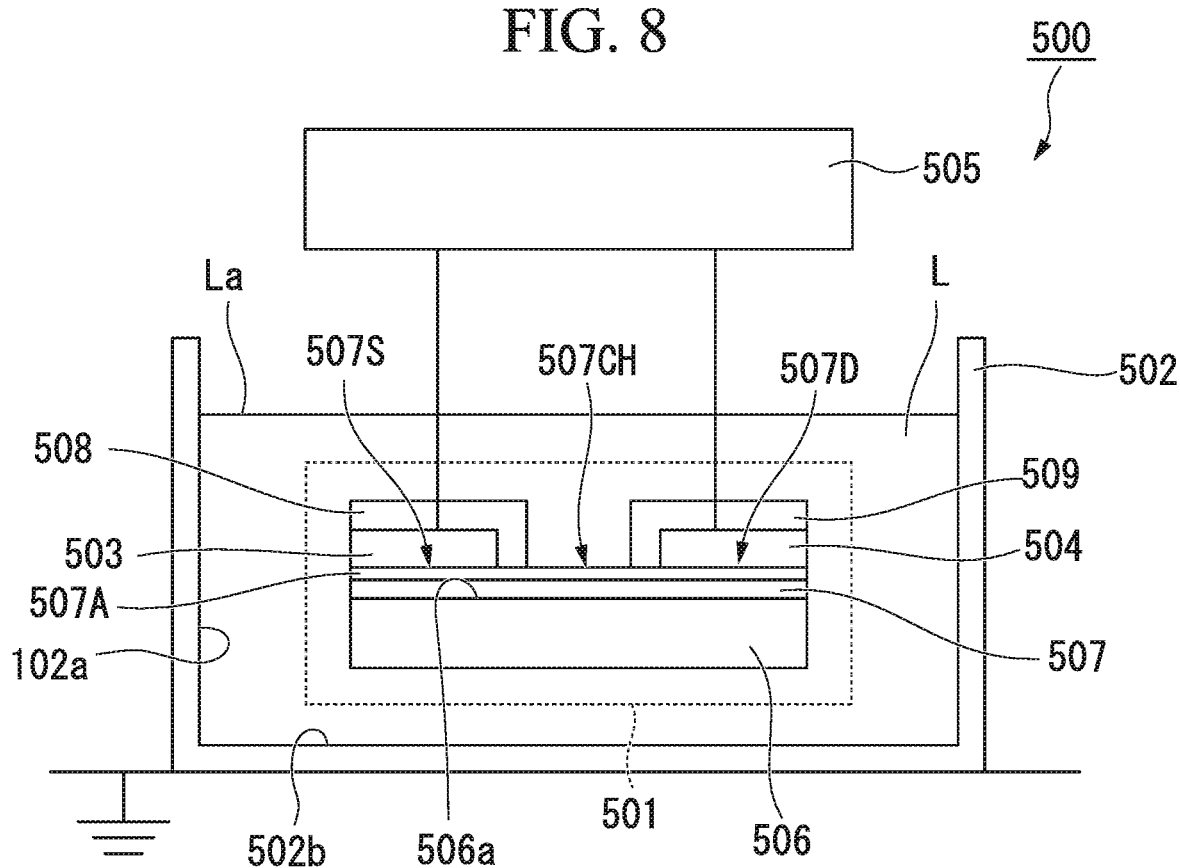
FIG. 8 is a cross sectional view illustrating an ion sensor according to a fifth embodiment of the present invention.

FIG. 8 is a cross sectional view illustrating an ion sensor 500 according to the fifth embodiment of the present invention. The ion sensor 500 includes a field effect transistor 501 as a working electrode and a metal container 502 having the same structure as the metal container 102 according to the first aspect as a reference electrode. The field effect transistor 501 has a structure in which the boron doped layer 507A is formed on the surface of the diamond thin film in the field effect transistor 101 according to the first embodiment. Even in the ion sensor 500 according to the present embodiment, the same effect as the ion sensor 100 according to the first embodiment can be obtained.

Example

Below, the effects of one or more embodiments of the present invention are clarified through examples. It should be noted that the present invention is not limited to the following examples, but can be implemented by appropriately making changes within a range not changing the gist thereof.

First Example

Figure 9:
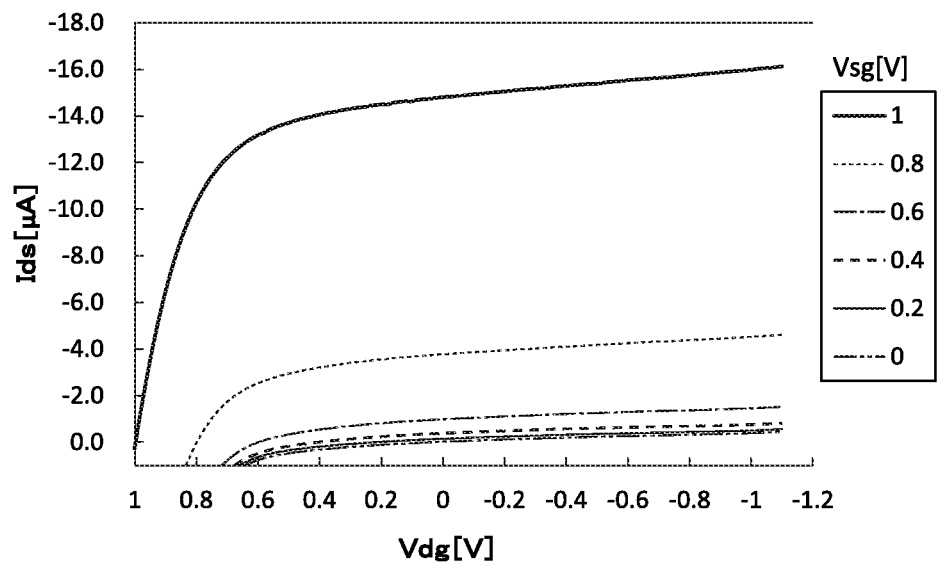
FIG. 9 is a graph illustrating current-voltage characteristic of a field effect transistor obtained with a first example of the present invention.

FIG. 9 is a figure illustrating a current-voltage characteristic of a field effect transistor 101 constituting the ion sensor 100 according to the first embodiment. FIG. 9 is a figure illustrating a relationship between: a voltage Vdg applied between the drain and the gate; and a current Ids, when a gate voltage Vsg is changed in a certain range (range of 0 to −1.0[V]), i.e., IV characteristic curves.

From this figure, it can be understood that as the gate voltage Vsg increases, the IV characteristic curve as a whole rises upward, and the current Ids flowing between the source and drain tends to increase. It can be understood that the characteristic curve in FIG. 9 moves upward as the ion concentration of the measurement target liquid L increases and moves downward as the ion concentration of the measurement target liquid L decreases.

In addition, the field effect transistor here is configured so that the reference electrode (gate electrode) is grounded, so the saturated current value can be obtained at Vdg=0 [V]. Therefore, when the ion sensor according to the present embodiment is used, the ion concentration can be measured with a simple procedure simply by grounding the two terminals, i.e., the metal container corresponding to the gate electrode and the drain electrode and changing the potential of the source electrode. In this case, it is possible to avoid the application of the gate voltage, which leads to deterioration of the field effect transistor, which occurred with conventional source-grounded circuits.

Figure 10:
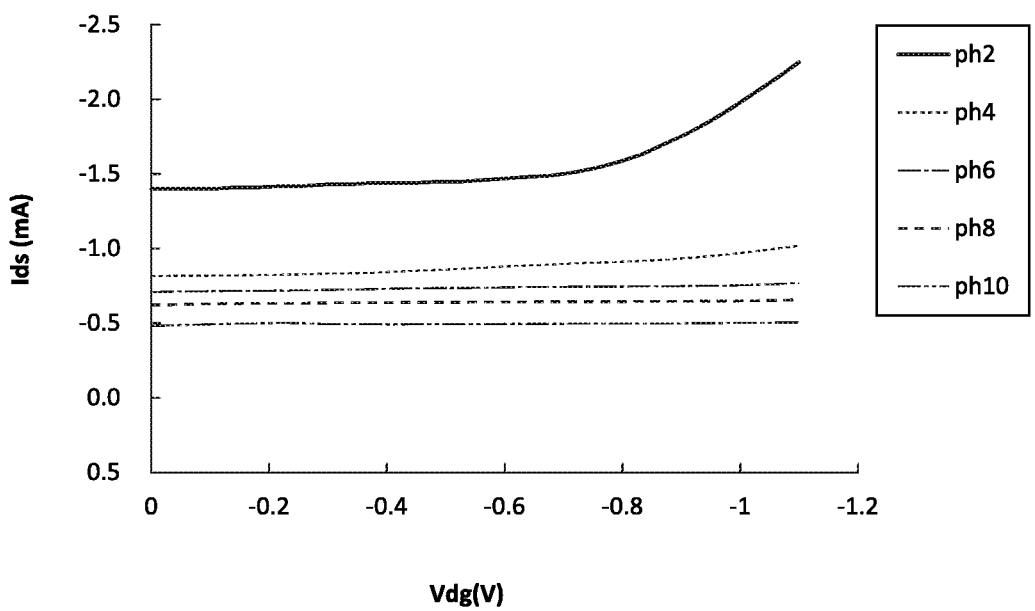
FIG. 10 is a graph illustrating current-voltage characteristic of the field effect transistor obtained with the first example of the present invention.

FIG. 10 is a figure illustrating is a figure illustrating another example of current-voltage characteristic of the field effect transistor 10 constituting the ion sensor 100 according to the first embodiment. FIG. 10 illustrates a relationship of between: a voltage Vsg applied between the gate and the source; and a current Ids flowing between the drain and the source, i.e., IV characteristic curves, when the gate voltage Vsg the hydrogen ion concentration pH is changed in a certain range (2 to 10). As the pH of the measurement target liquid L increases, the rise of Ids tends to become steep. Therefore, it can be understood that pH can be calculated from the IV characteristic curves.

First Comparative Example

Figure 11:
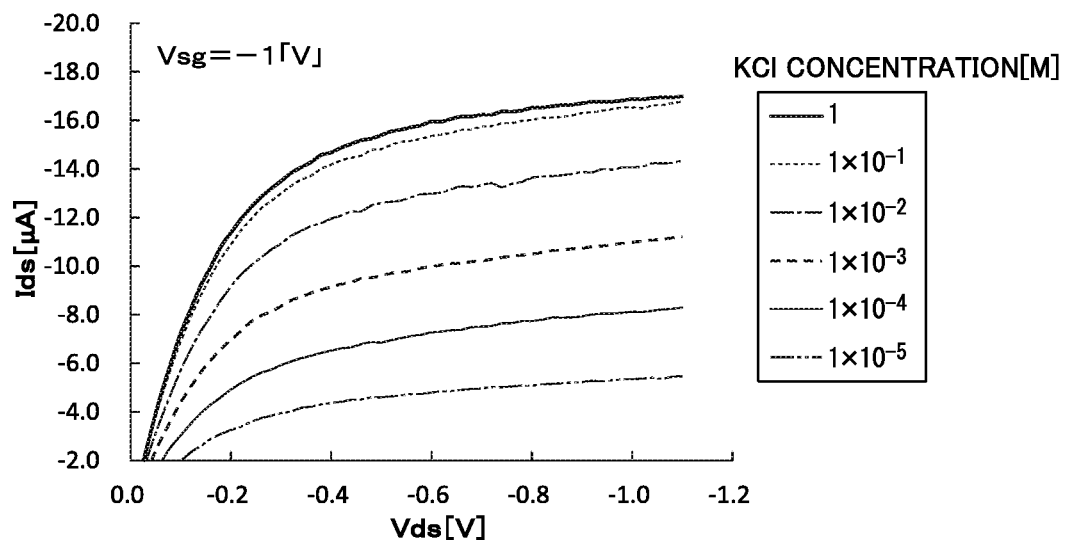
FIG. 11 is a graph illustrating current-voltage characteristic of a field effect transistor obtained with a first comparative example of the present invention.

FIG. 11 is a figure illustrating IV characteristic curves obtained by measuring the concentration of chloride ions in potassium chloride solution by using a conventional ion sensor having a source-grounded circuit. Since the field effect transistor here is configured so that the source portion is grounded, it can be understood that almost no output (current Ids) is obtained at Vds=0 [V]. Therefore, in the case where the conventional ion sensor is used, it is necessary to apply a high voltage between the drain and the source in order to obtain the saturated current value, and as a result, deterioration of the field effect transistor is accelerated.

Second Example

Figure 12:
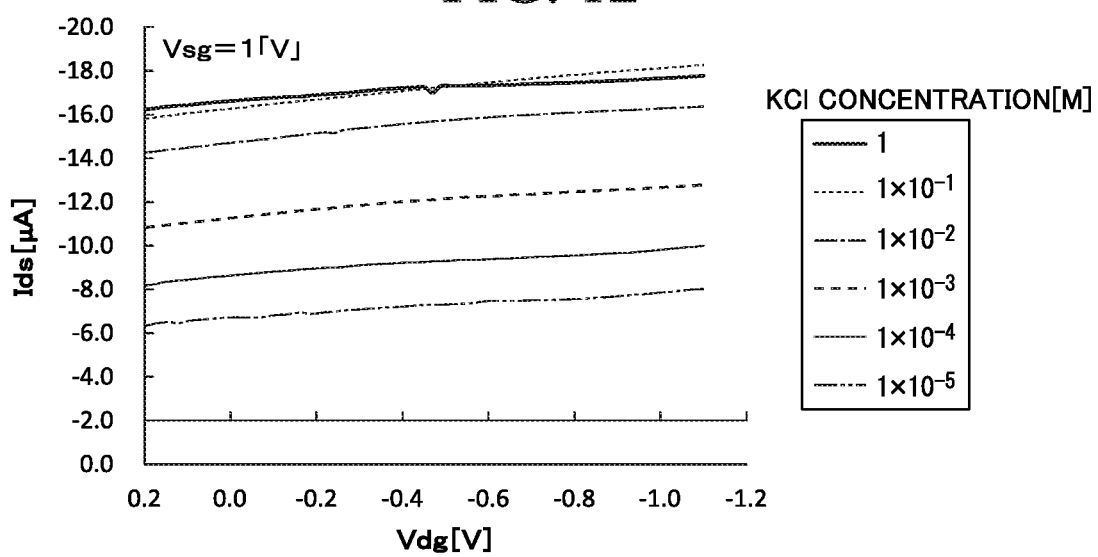
FIG. 12 is a graph illustrating current-voltage characteristic of a field effect transistor obtained with a second example of the present invention.

FIG. 12 is a figure illustrating IV characteristic curves obtained by measuring the concentration of chloride ions in potassium chloride solution by using the ion sensor according to one or more embodiments of the present invention having a gate-grounded circuit. It can be understood that since the field effect transistor here is configured so that the gate electrode (reference electrode) is grounded, a sufficient output (Ids) is obtained at Vdg=0 [V]. Therefore, when the ion sensor of one or more embodiments of the present invention is used, it is not necessary to apply a voltage between the drain and the gate, and degradation of the field effect transistor due to the voltage application between the drain and the gate can be avoided.

Third Example

The output characteristic of the ion sensor 300 according to the third embodiment was evaluated. The circuit driving the field effect transistor of the working electrode 301 is configured to be a gate ground circuit. A boron doped conductive diamond electrode (BDD electrode) was used as the reference electrode. Polycrystalline diamond (support: Si) which is partially oxygen terminated and in the size of 10 mm square with a thickness of 0.5 mm and was used as the BDD electrode. A standard solution adjusted to have pH 2 to pH 12 with Carmody wide range buffer was used as a measurement target liquid of the ion sensor 300.

Figure 13:
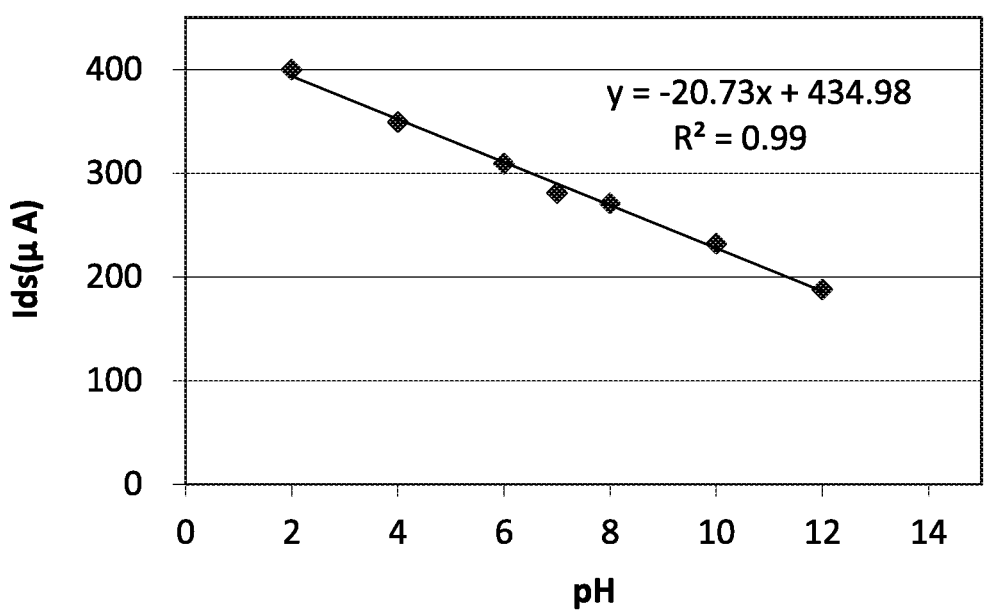
FIG. 13 is a graph illustrating pH-Ids characteristic of a field effect transistor obtained with a third example of the present invention.

FIG. 13 is a graph obtained by plotting Ids as a sensor output value when Vdg=0 V and Vsg=−2 V using the gate-grounded method in the working electrode 301 of the ion sensor with this example. In the graph, the horizontal axis represents the pH value and the vertical axis represents the Ids. In the gate-grounded method using the BDD electrode for the reference electrode, the potential of the reference electrode is stable and a clean linear characteristic is obtained from the acidic area to the alkaline area. Therefore, the pH value can be calculated from the output value (Ids) of the ion sensor 300.

Fourth Example, Second Comparative Example

As the fourth example, a platinum electrode was used as the reference electrode, and the output characteristic of the ion sensor 300 according to the third embodiment was evaluated in the same way as in the third example. As the second comparative example, Ag/AgCl electrode was used as the reference electrode, and the output characteristic of the ion sensor 300 according to the third embodiment was evaluated in the same way as in the third example.

Figure 14A:
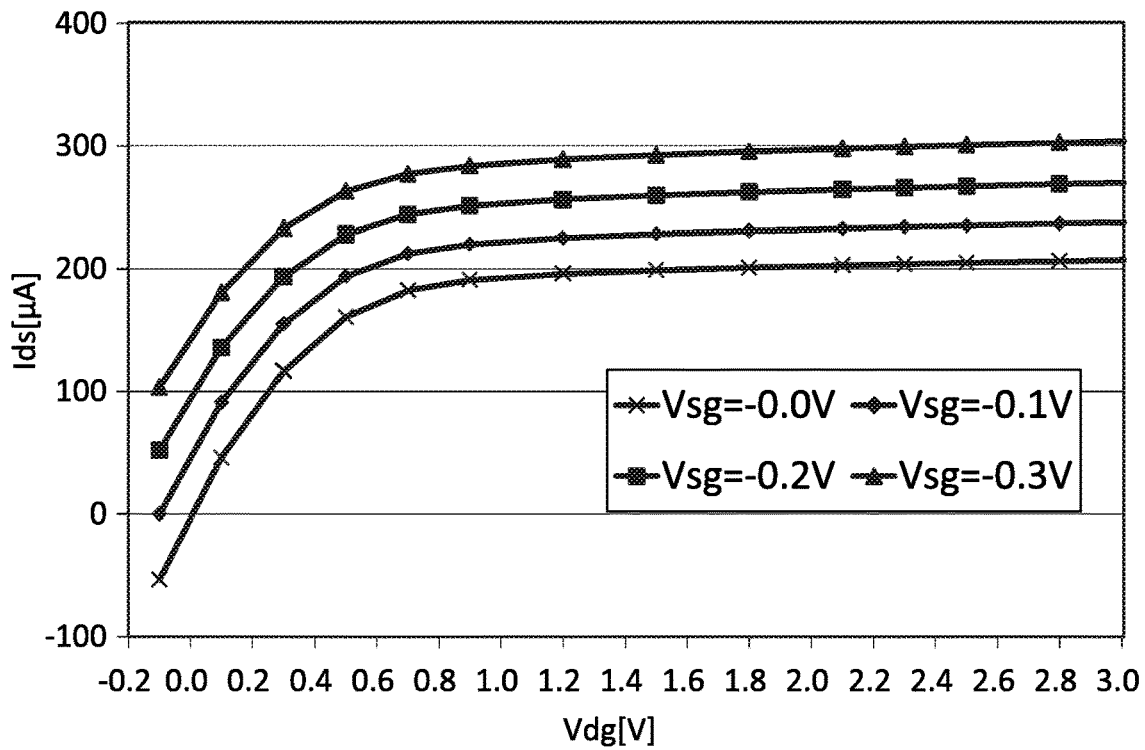
FIG. 14A is a graph illustrating current-voltage characteristic of the field effect transistors obtained with a fourth example and a second comparative example of the present invention.
Figure 14B:
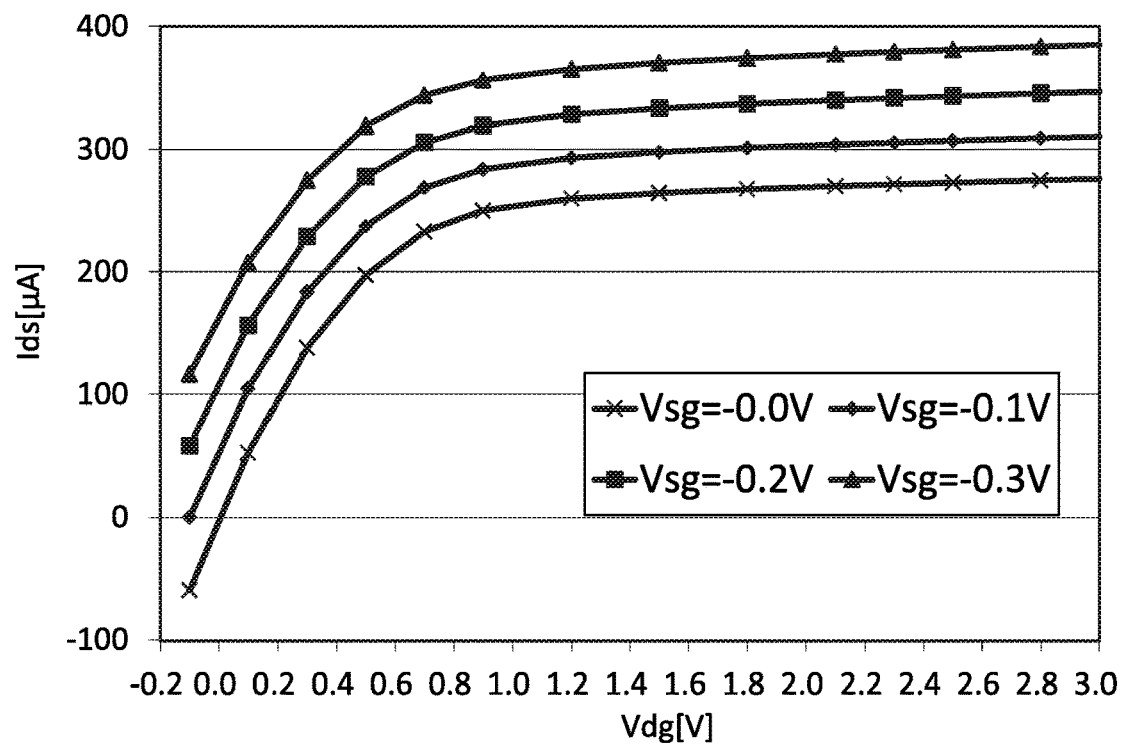
FIG. 14B is a graph illustrating current-voltage characteristic of the field effect transistors obtained with the fourth example and the second comparative example of the present invention.
Figure 15A:
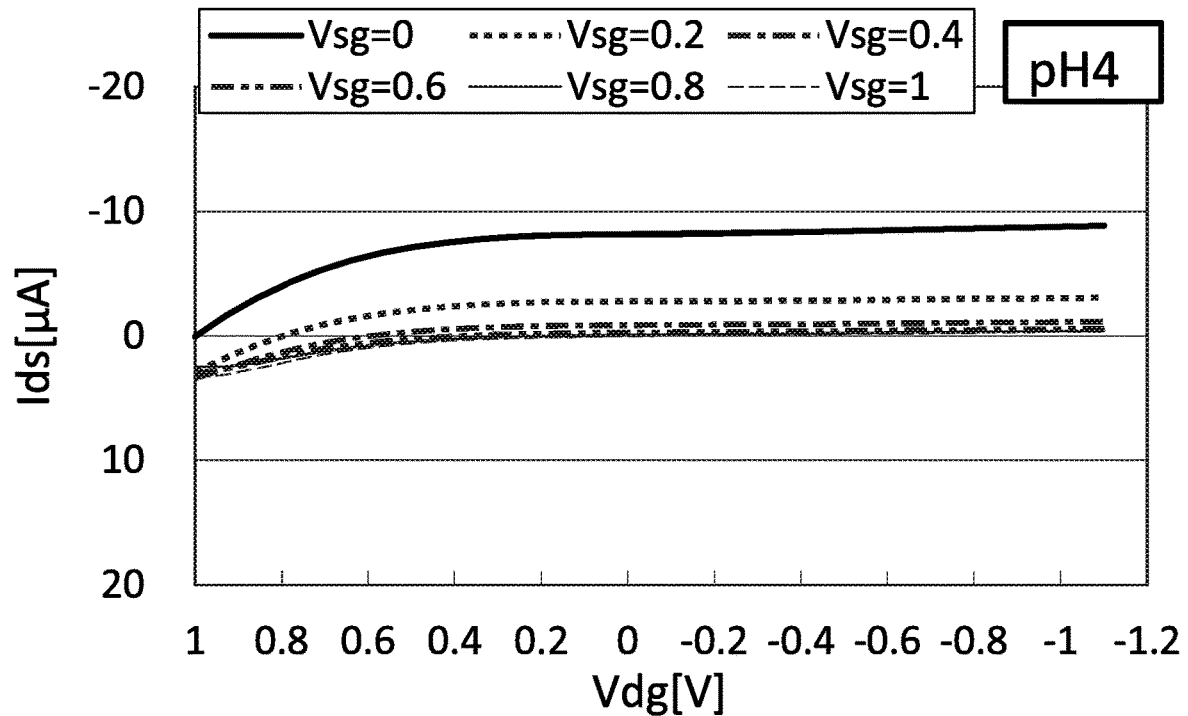
FIG. 15A is a graph illustrating current-voltage characteristic of a field effect transistor obtained with a fifth example of the present invention.
Figure 15B:
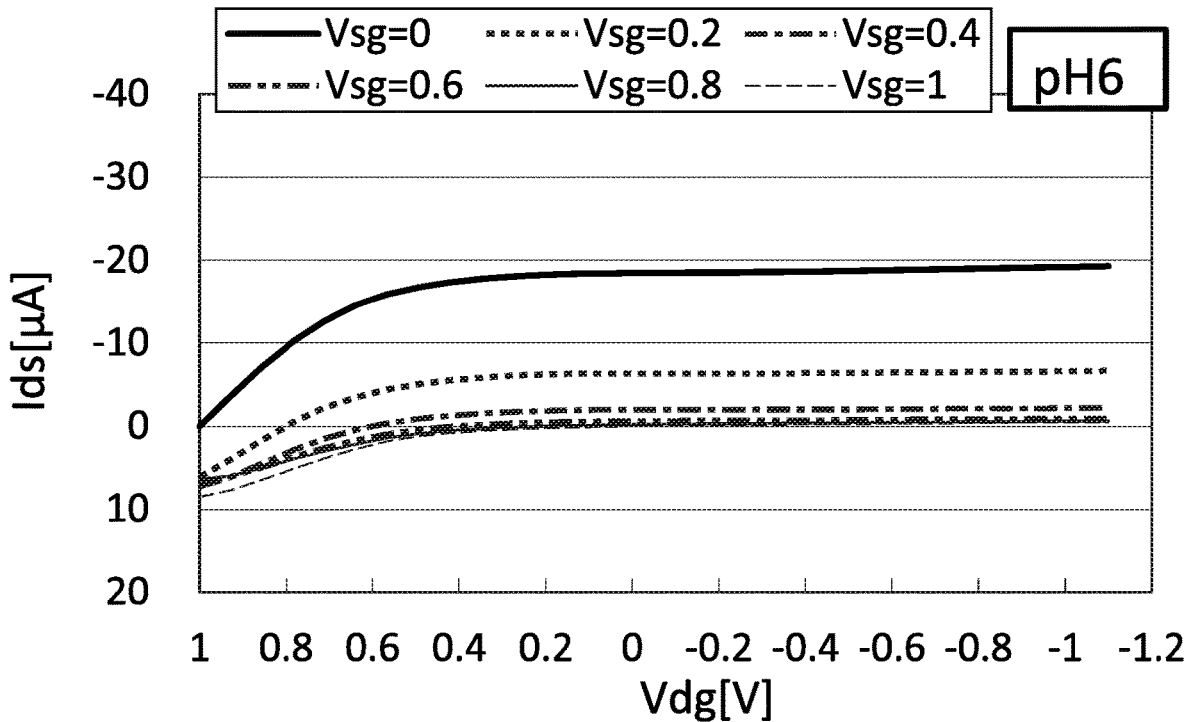
FIG. 15B is a graph illustrating current-voltage characteristic obtained with the fifth example of the present invention.
Figure 15C:
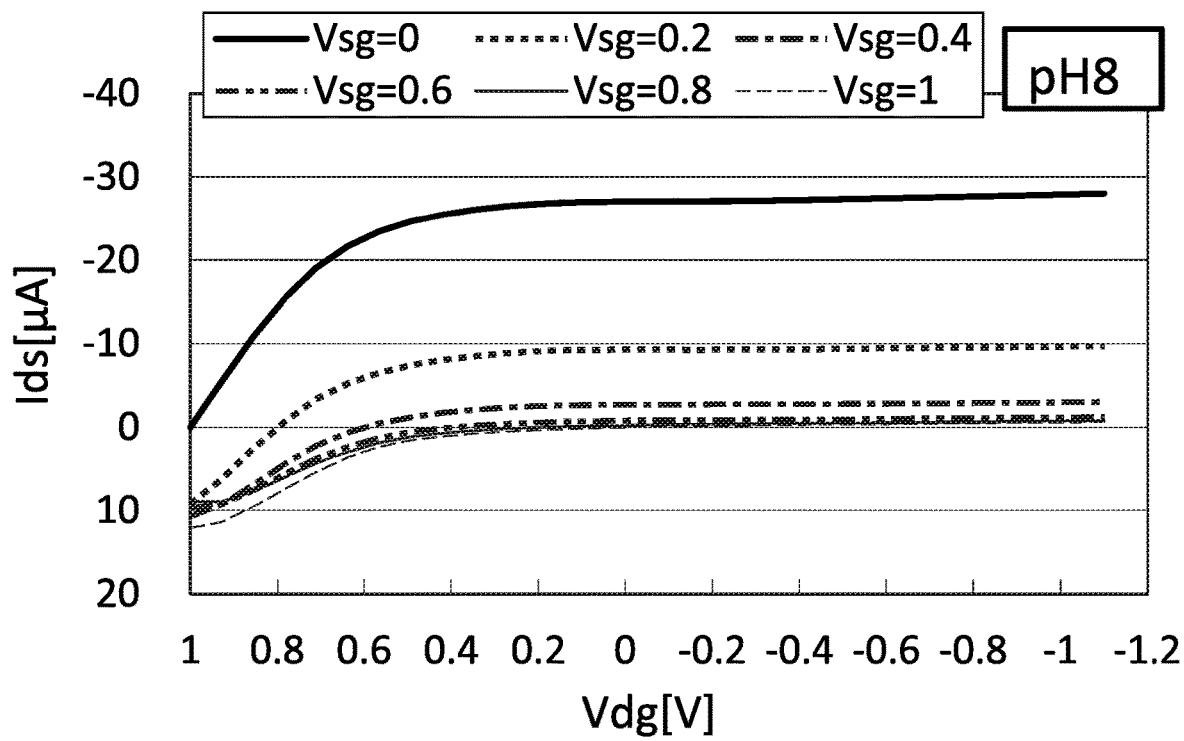
FIG. 15C is a graph illustrating current-voltage characteristic of the field effect transistor obtained with the fifth example of the present invention.
Figure 15D:
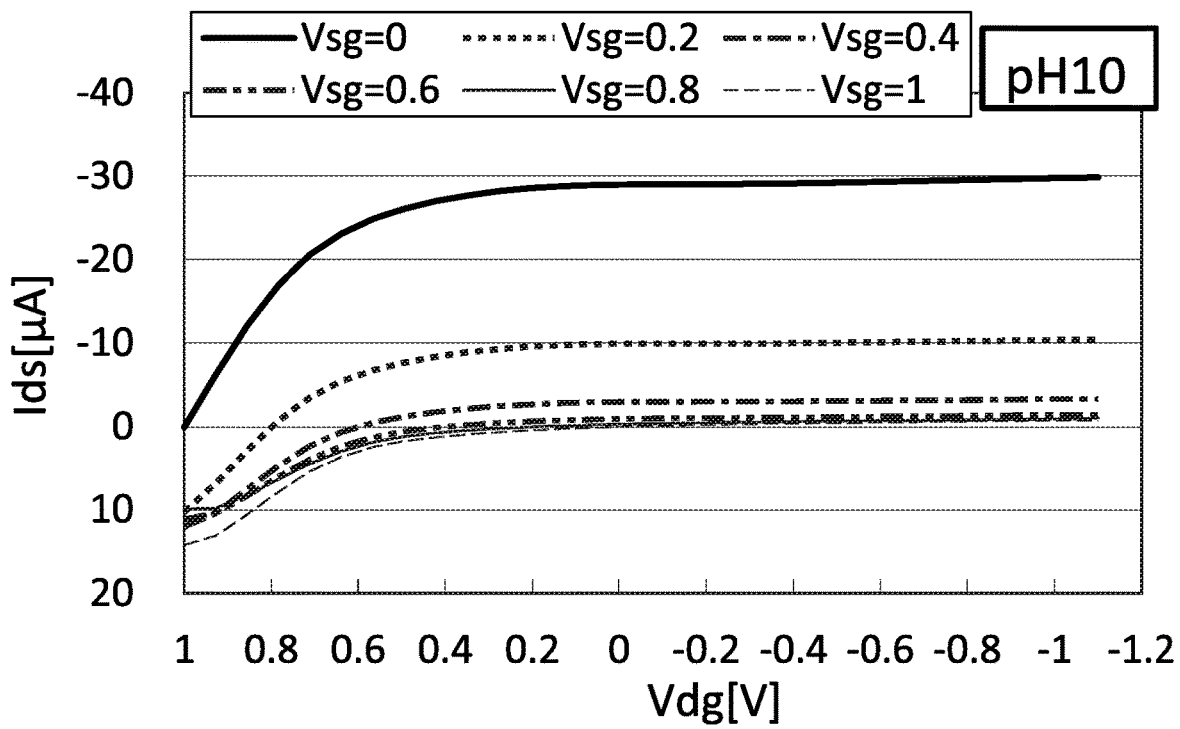
FIG. 15D is a graph illustrating current-voltage characteristic of the field effect transistor obtained with the fifth example of the present invention.
Figure 16A:
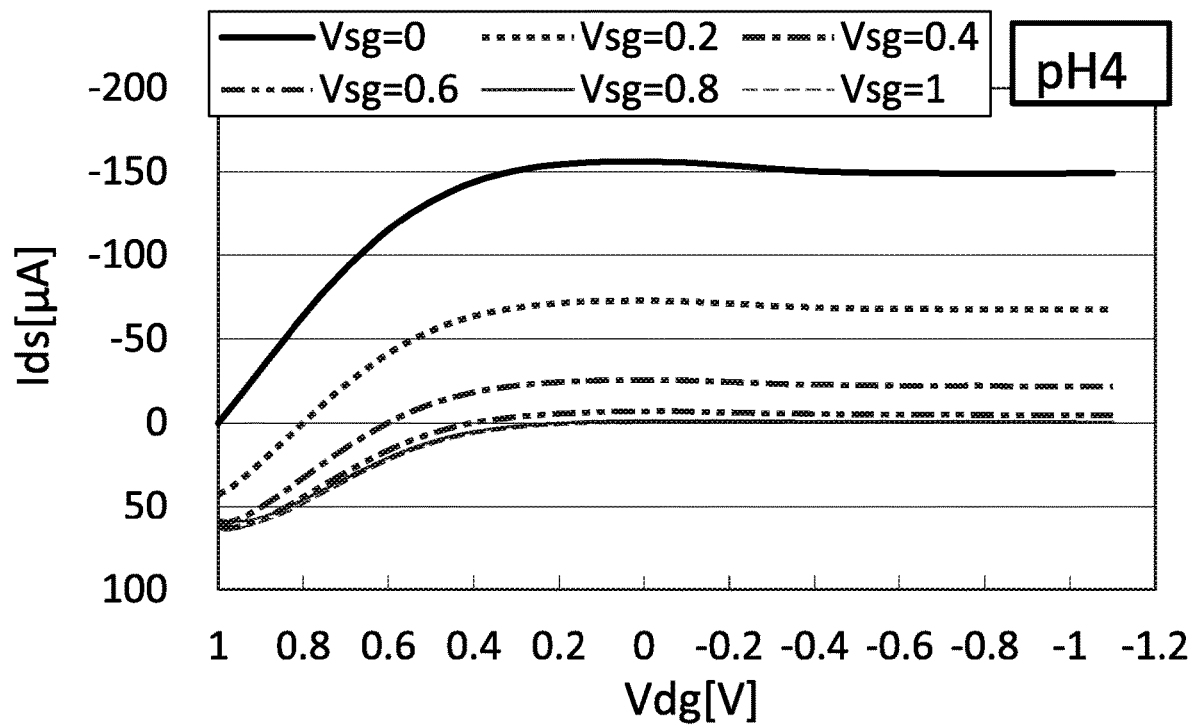
FIG. 16A is a graph illustrating current-voltage characteristic of the field effect transistor obtained with a sixth example of the present invention.
Figure 16B:
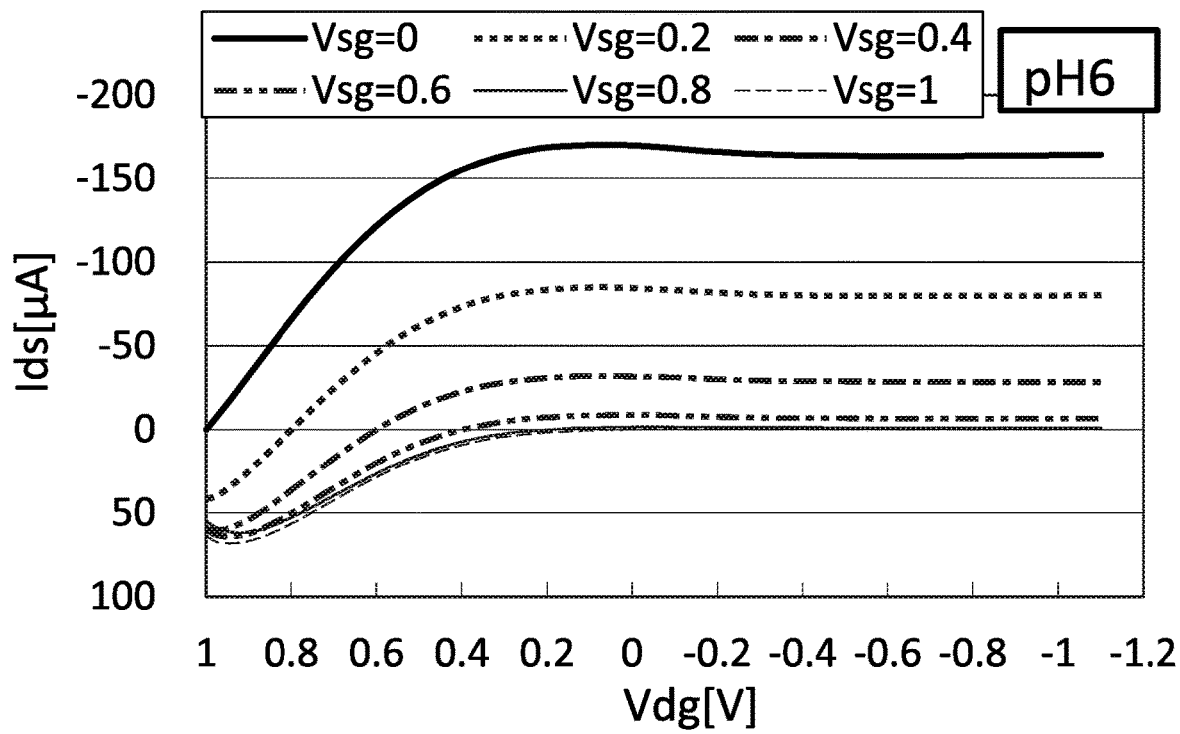
FIG. 16B is a graph illustrating current-voltage characteristic of the field effect transistor obtained with the sixth example of the present invention.
Figure 16C:
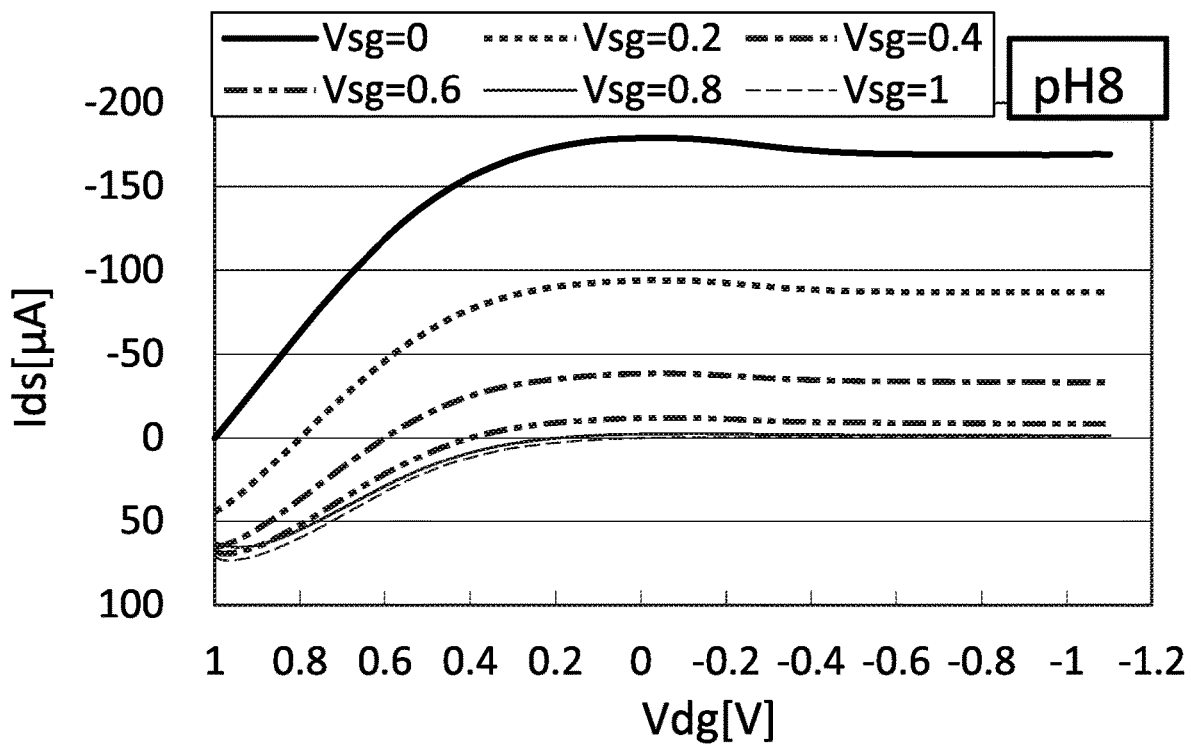
FIG. 16C is a graph illustrating current-voltage characteristic of the field effect transistor obtained with the sixth example of the present invention.
Figure 16D:
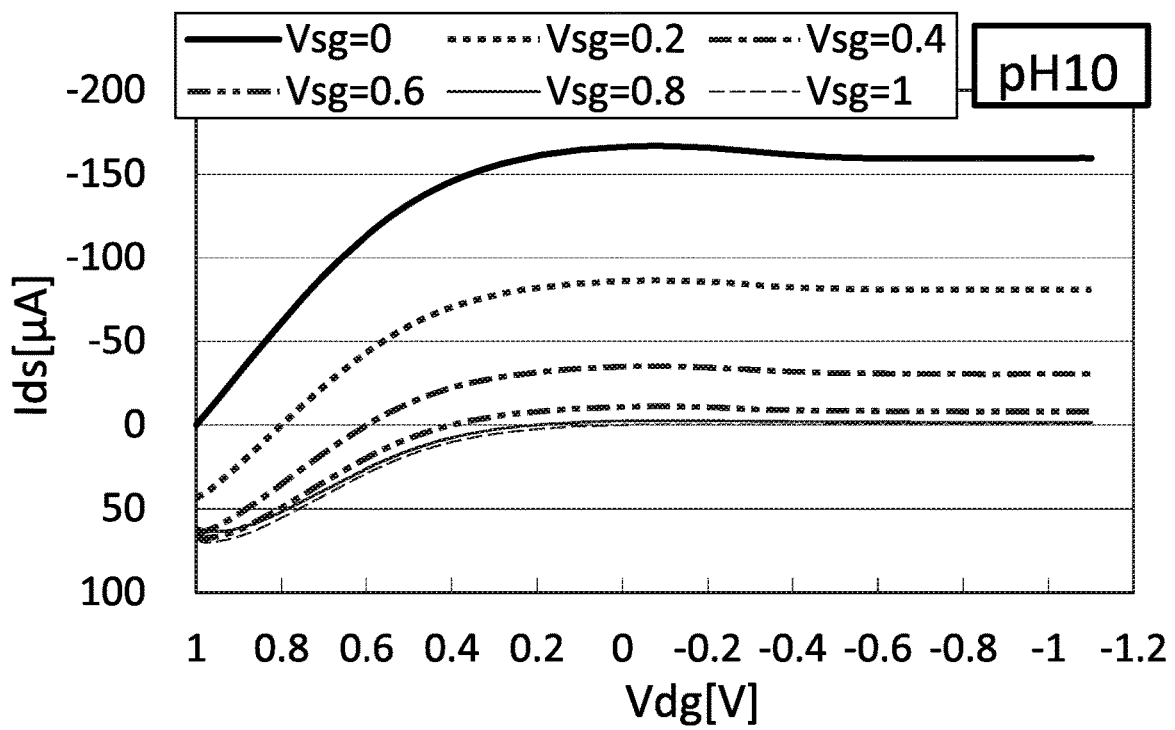
FIG. 16D is a graph illustrating current-voltage characteristic of the field effect transistor obtained with the sixth example of the present invention.

FIG. 14A, FIG. 14B are graphs in which, in the case where platinum and Ag/AgCl, respectively, are used as the reference electrode of the ion sensor according to the fourth example, the Ids is plotted as the sensor output value when it is configured that Vsg=−0.3 to 0V at the working electrode. In any of the graphs, the horizontal axis represents Vgd and the vertical axis represents Ids.

Even when platinum is used for the reference electrode, Vdg-Ids curve is obtained as theoretically as in the case of using the Ag/AgCl standard electrode. In the gate-grounded method using a platinum electrode as the reference electrode, a pH sensor can be constructed to make use of chemical stability and strong corrosion resistance against acid which are characteristic of platinum. When platinum is used, as shown in FIG. 14A, FIG. 14B, non-saturated output characteristic may be obtained at Vdg=0 due to physical properties of metal electrode (chemical state of surface, morphology of surface, impurity state etc.) and output characteristic of the output sensor, but the current (Ids) flows at Vdg=0, which is a characteristic of the gate-grounded method, and the function as an ion sensor can be achieved.

Fifth Example

As the fifth example, the output characteristic of the ion sensor 400 according to the fourth embodiment was evaluated. Polycrystalline diamond (support: Si) which is partially oxygen terminated and in the size of 10 mm square with a thickness of 0.5 mm was used as the diamond thin film 407. A standard solution adjusted to have pH 2 to pH 12 with Carmody wide range buffer was used as a measurement target liquid of the ion sensor 400.

Sixth Example

As the sixth example, the output characteristic of the ion sensor 400 according to the third embodiment was evaluated. The diamond thin film 407 was hydrogen terminated, and a material having a structure similar to that of the fifth embodiment was used as the material thereof. A liquid having a composition similar to that of the fifth embodiment was used as a measurement target liquid of the ion sensor 400.

FIG. 15A to FIG. 15D are graphs obtained by plotting Ids as the sensor output value when pH value is configured to be 4, 6, 8, 10, respectively, at the working electrode 401 of the ion sensor according to the fifth example. FIG. 16A to FIG. 16D are graphs obtained by plotting Ids as the sensor output value when pH value is configured to be 4, 6, 8, 10, respectively, at the working electrode 401 of the ion sensor according to the sixth example. In any of the graphs, the horizontal axis represents Vdg and the vertical axis represents Ids.

When the liquid-contact surface of the field effect transistor of diamond is configured to be partially oxygen-terminated, the Ids output value decreases as compared with the case of hydrogen termination, but Vdg-Ids curve according to the theory is obtained, and pH shift corresponding to the pH value is obtained.

Figure 17:
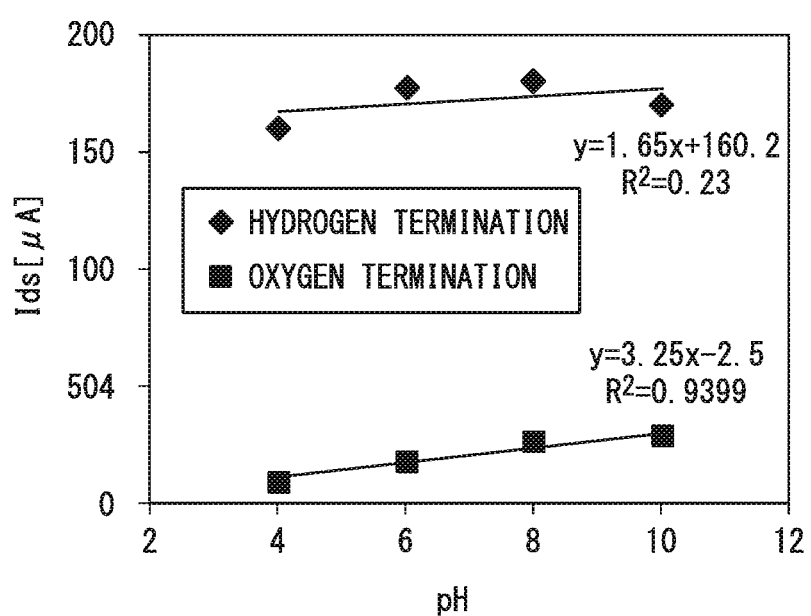
FIG. 17 is a graph illustrating pH-Ids characteristic of the field effect transistors obtained with the fifth, sixth example of the present invention.

FIG. 17 is a graph obtained by plotting Ids as the sensor output value when it is configured that Vdg=0V, Vsg=1V at the working electrode 401 of the ion sensor according to the fifth, sixth examples. The horizontal axis (x axis) of the graph represents the pH value and the vertical axis (y axis) represents Ids.

In the case of hydrogen termination, an error occurs in alkali area, so the correlation coefficient $R^2$ at pH 4 to pH 10 is low, but in the case of partial oxygen termination, as a result of suppression of this erroneous difference, a strong correlation can be observed with $R^2$ equal to or more than 0.93 at pH 4 to pH 10.

As the seventh example, the output characteristic of the ion sensor 500 according to the fifth embodiment was evaluated. The liquid-contact surface of the boron doped layer 507A was partially oxygen terminated. As the metal container 502, a stainless steel container made of SUS 304 (capacity: 200 mL) was used. For the IV control measurement, a semiconductor parameter analyzer was used. A sample adjusted to have pH 4 to pH 12 with Carmody wide range buffer was used. A standard solution adjusted to have pH 2 to pH 12 with Carmody wide range buffer was used as a measurement target liquid of the ion sensor 500. The metal container 502 functions as a gate electrode, which is grounded to make the gate-grounded configuration.

Figure 18A:
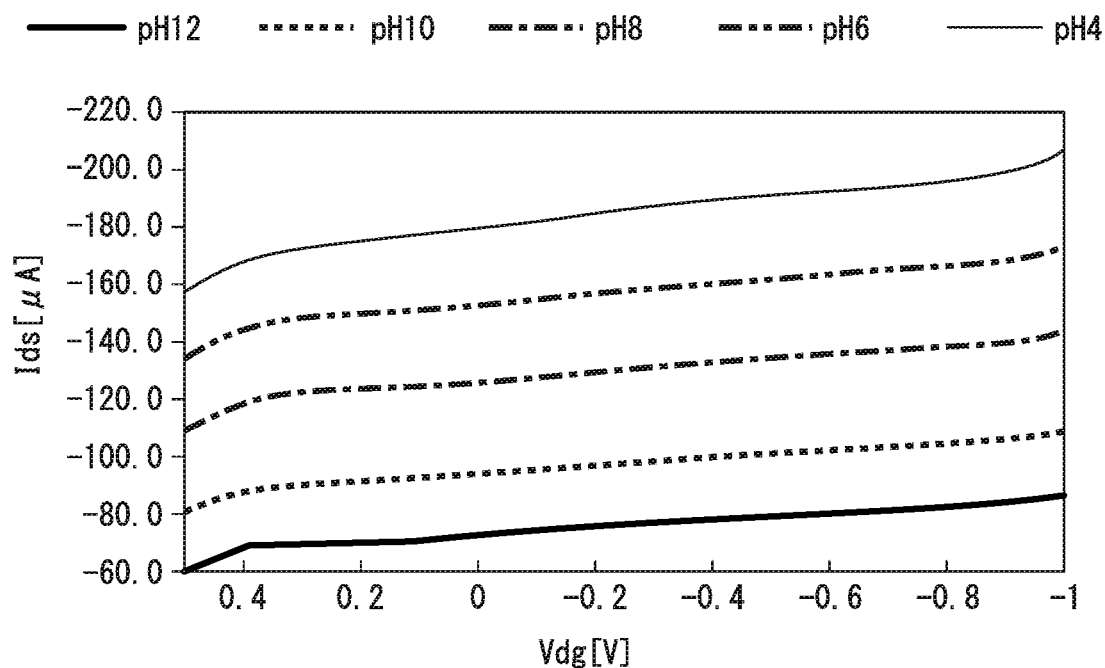
FIG. 18A is a graph illustrating current-voltage characteristic of a field effect transistor obtained with a seventh example of the present invention.

FIG. 18A is a graph illustrating characteristic of the obtained sensor output value Ids when it is configured that Vsg=−0.8V and Vdg is configured to be −1 to 0.5V at the working electrode 501 of the ion sensor according to the seventh example. The horizontal axis represents Vdg and the vertical axis represents Ids. It can be understood that Ids output value is shifted according to the pH value, and Ids has correlation with pH. In this case, the relation that the current value decreases according to the rise of the pH value is obtained. This is a typical relationship obtained with a configuration using a stainless steel container and an ion sensor, but since pH value is uniquely determined according to sensor output value Ids, the ion sensor 500 can be caused to function as a pH sensor.

Figure 18B:
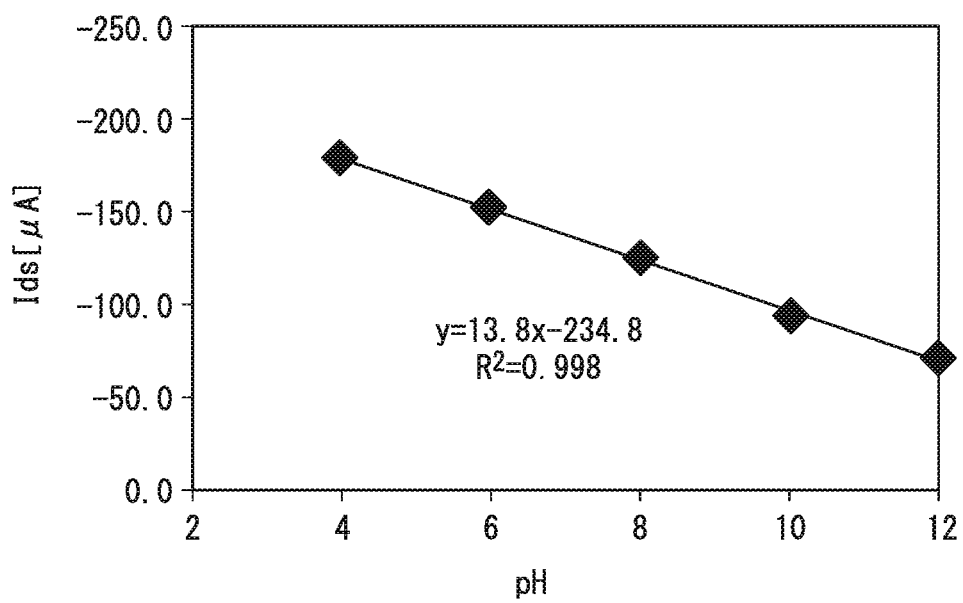
FIG. 18B is a graph illustrating pH-Ids characteristic of the field effect transistor obtained with the seventh example of the present invention.

In the result of FIG. 18A, a result obtained by plotting the Ids value at Vdg=0 with the horizontal axis being pH value and the vertical axis being Ids is shown in FIG. 18B. Since there is a correlation between Ids and pH at pH 4 to pH 12, it can be understood that the pH can be calculated from the sensor output value (7.7%/pH obtained by standardizing pH sensitivity: 13.8 μA/pH with the maximum current 180 μA).

First Usage Example

Figure 19A:
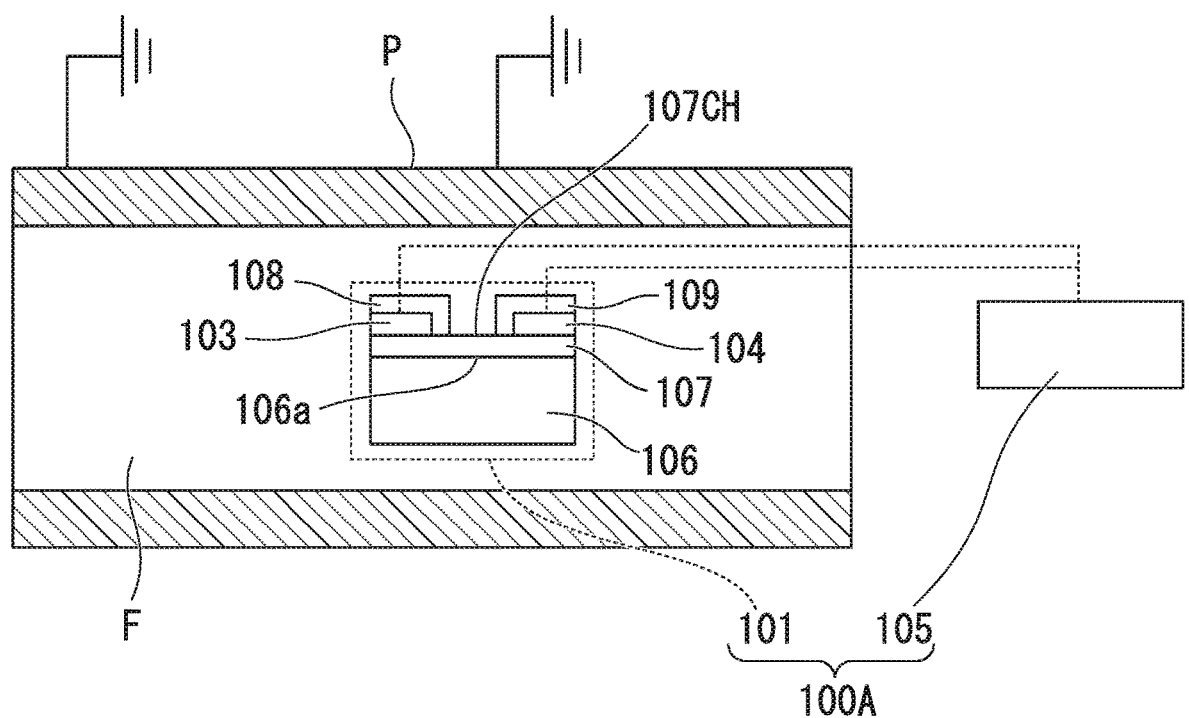
FIG. 19A is a figure illustrating an example (first usage example) of ion sensing using an electronic component of the present invention.

FIG. 19A illustrates an example of performing ion sensing of fluid F flowing in a pipe P using the electronic component 100A of FIG. 4. As shown in FIG. 19A, a pH value measuring diamond field sensor transistor (ion sensor) 101 is disposed at a desired position in the grounded pipe P, and is caused to be in an immersed state in the fluid F flowing in the pipe P.

Examples of materials of the pipe P include stainless steel, copper and the like, but the material of the pipe P is not limited thereto. The grounding method of the pipe P is not particularly limited. In the usual case, the grounding is performed at one position, but may be performed at a plurality of positions depending on the necessity, such as the material, length, resistance value, surrounding configuration of the pipe P. The pipe P functions as a gate electrode, which is grounded to make the gate-grounded configuration.

Thus, when the electronic component according to one or more embodiments of the present invention is used, the ion concentration of the fluid F in the pipe P can be easily measured without processing the pipe P.

Here, the example is shown in which the diamond effect transistor 101 according to the first embodiment is used as the field effect transistor to be arranged in the pipe P, but this may be replaced with the field effect transistor (Si-ISFET) 201 according to the second embodiment.

Figure 19B:
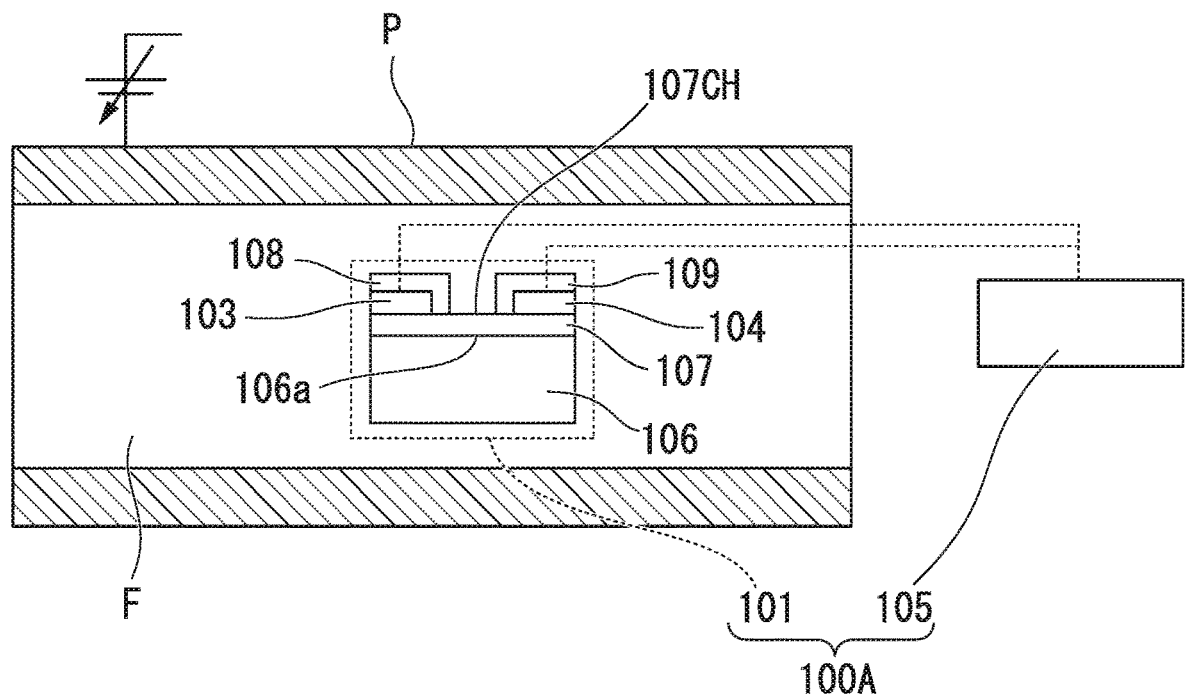
FIG. 19B is a figure illustrating an example (first usage example) of ion sensing using the electronic component of the present invention.

FIG. 19B shows another example of performing ion sensing of fluid F flowing in the pipe P, using the electronic component 100A of FIG. 4, similarly to FIG. 19A. Even though the pipe P is not grounded, as long as the pipe P is fixed at a predetermined potential as shown in FIG. 19B, the same effect as those of FIG. 19A can be obtained.

Second Usage Example

Figure 20:
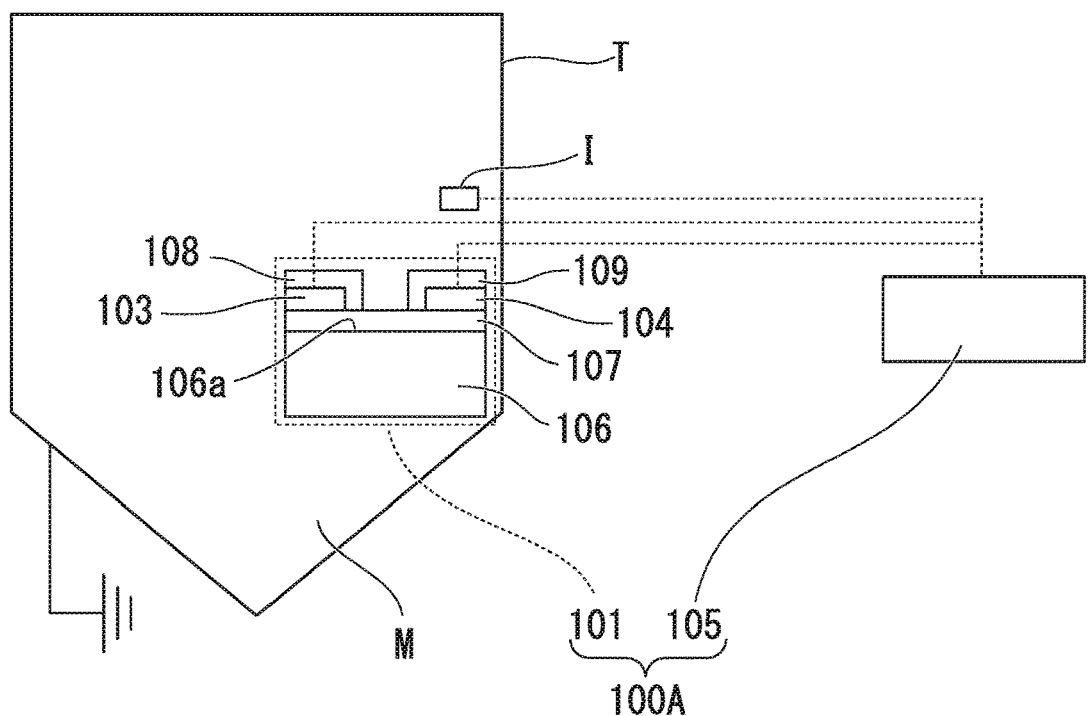
FIG. 20 is a figure illustrating another example (second usage example) of ion sensing using the electronic component of the present invention.

FIG. 20 illustrates an example using the electronic component 100A of FIG. 4 in a production step of a fermented food. A diamond field effect transistor 101 constituting the electronic component 100A is arranged at a desired position in a grounded fermentation tank T together with a thermometer I.

For example, as disclosed in Patent Literature 3, since the pH of the fermented food has correlation with the progress of fermentation, the progress of the fermentation step can be managed by placing a fermentation material M in the fermentation tank T and measuring its pH by using the electronic component 100A.

Examples of fermented food serving as the target of the measurement is not particularly limited, but examples thereof include yoghurt, sake, soy sauce, miso, or the like.

As an example, the case of using the electronic component 100A in the yoghurt production step will be described. First, a yoghurt production source liquid such as milk, degreased (powdered) milk, fresh cream, or the like is stored in the fermentation tank T, and the field effect transistor(s) 101 are installed at one or more places in the tank T.

Subsequently, a lactic acid bacteria starter for yogurt fermentation is added, and fermentation is caused at a fermentation temperature suitable for the used lactic acid bacteria. As the lactic acid fermentation progresses, the pH value of the source liquid decreases, and when reaching a predetermined value indicating acidity, it can be determined that the fermentation step has been completed.

Here, the example is shown in which the diamond field effect transistor 101 according to the first embodiment is used as the field effect transistor arranged in the fermentation tank T, but this may be replaced with the field effect transistor (Si-ISFET) 201 according to the second embodiment.

Modification

The diamond semiconductor constituting the diamond field effect transistor type sensor device according to one or more embodiments of the present invention is not limited to what has been described in the first embodiment (diamond thin film Si substrate), and examples thereof include a diamond substrate, a diamond thin film ceramic substrate, polycrystalline diamond substrate, monocrystalline diamond substrate, highly oriented polycrystalline diamond substrate, a doped-diamond substrate composed of a non-doped diamond substrate and boron, or the like. Furthermore, examples thereof include partial oxygen termination diamond and partial amino termination diamond having pH sensitivity.

Examples of field effect transistor type sensor devices constituting the ion sensor according to one or more embodiments of the present invention include not only the diamond field effect transistor type sensor device and Si-ISFET explained as the second embodiment but also organic semiconductor ISFET and carbon ISFET using carbon material (graphene, carbon nanotube CNT, diamond like carbon DLC, or the like).

Examples of field effect transistor type sensor devices constituting the ion sensor according to one or more embodiments of the present invention include not only the diamond field effect transistor type sensor device and Si-ISFET explained as the second embodiment but also organic semiconductor ISFET and carbon ISFET using carbon material (graphene, carbon nanotube CNT, diamond like carbon DLC, or the like). Alternatively, the field effect transistor type sensor device may be a field effect transistor type sensor having SGFET structure, and examples thereof include an SGFET sensor using CNT and an SGFET sensor using graphene.

Figure 21:
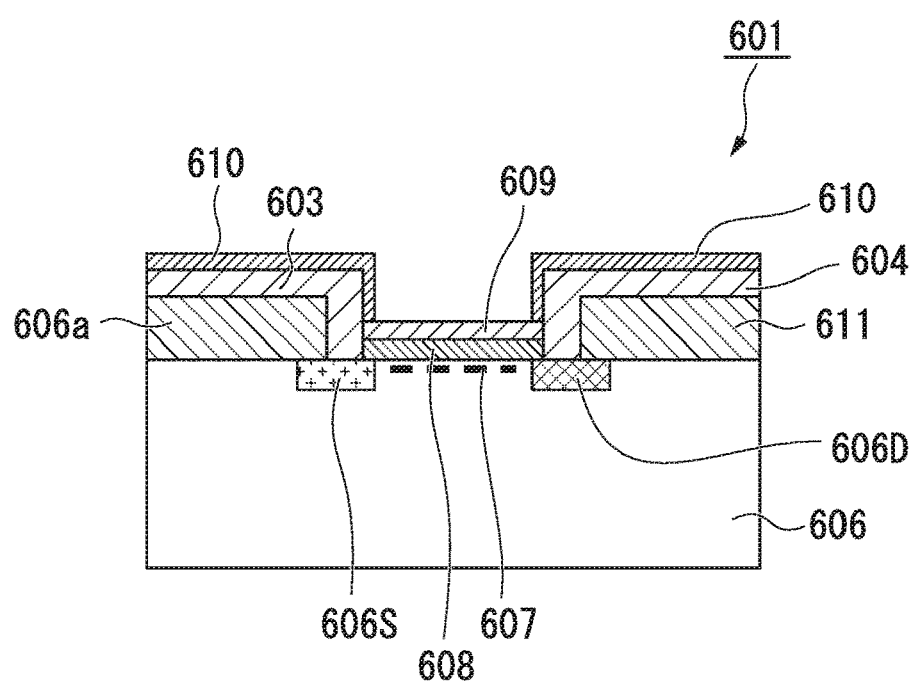
FIG. 21 is a cross sectional view illustrating a portion of a field effect transistor in an ion sensor according to a modification of one or more embodiments of the present invention.

The Si-ISFETs constituting the ion sensor according to one or more embodiments of the present invention is not limited to those described in the second embodiment. FIG. 21 illustrates a configuration example of the Si-ISFET. An Si-ISFET 601 illustrated in FIG. 21 is configured such that, on one of main surfaces 606a of a p-type silicon substrate 606, a source area 606S constituted by an n+ layer and a drain area 606D constituted by an n+ layer are formed to be away from each other, and an ion-sensitive film 609 is formed on a portion (channel) 607 between the source area 606S and the drain area 606D with a gate oxide film 608 made of $SiO_2$ film interposed therebetween. Examples of the ion-sensitive film 609 include $Ta_2O_5$ film, $Si_3N_4$ film, $SiO_2$ film, $Al_2O_3$ film, or the like. A source electrode 603 is formed on the source area 606S, a drain electrode 604 is formed on the drain area 606D, and a protective film 610 is formed on each electrode. Examples of materials of the source electrode 603 and the drain electrode 604 include gold, titanium gold, or the like. Examples of materials of the protective film 610 include nitrides (silicon nitride or the like), a resist, or an organic matter (fluoride resin or the like such as Teflon (registered trademark)), an oxide (glass, Pyrex (registered trademark), or the like. On one of main surfaces 606a of the p-type silicon substrate, a field oxide film 611 is formed on inactive areas of the ISFET.

Third Usage Example

The ion sensor according to one or more embodiments of the present invention drives the ISFET sensor device by fixing the reference electrode (gate electrode) potential, and can also be used as a semiconductor sensor for ion concentration measurement other than pH without the measurement target ions being limited to hydrogen ion (pH).

For example, in the ion sensor (Si-ISFET) 200 described as the second embodiment, the ion-sensitive film 209 may be changed from the film having sensitivity for hydrogen ion ($Ta_2O_5$ film or the like) to a film having sensitivity for other ions.

In the diamond field effect transistor 101 described as the first embodiment, the liquid contact portion termination element of the diamond thin film 107 may be controlled according to the type of the measurement target ion (chloride ion, calcium ion, potassium ion, or the like).

The ion sensor according to one or more embodiments of the present invention can also be applied to a liquid electrolyte containing biomolecules, DNA, or the like as disclosed in Patent Literature 4, for example, and can also function as a bio sensor.

INDUSTRIAL APPLICABILITY

Embodiments of the present invention can be widely applied to an ion sensor, an ion concentration measurement method using the ion sensor, and an electronic component constituting the ion sensor.

Although the disclosure has been described with respect to only a limited number of embodiments, those skilled in the art, having benefit of this disclosure, will appreciate that various embodiments may be devised without departing from the scope of the present invention. Accordingly, the scope of the invention should be limited only by the attached claims.

REFERENCE SIGNS LIST 100, 200 ion sensor
101, 201 field effect transistor constituting working electrode
102, 202 metal container as reference electrode
102a, 202a side surface of metal container as reference electrode
102b, 202b bottom surface of metal container as reference electrode
103, 203 source electrode
104, 204 drain electrode
105, 205 field effect transistor and driving circuit constituting working electrode
106, 206 substrate
106a, 206a one of main surfaces of substrate
107 diamond thin film
107CH channel area as working electrode 107S source area
107D drain area
108, 109 protective film
208 oxide film
209 ion-sensitive film
601 Si-ISFET
603 source electrode
604 drain electrode
606 p-type silicon substrate
606a one of main surfaces
606S source area
606D drain area
607 channel
608 gate oxide film
609 ion-sensitive film
610 protective film
611 field oxide film
L measurement target liquid
P pipe
F fluid
T fermentation tank
I thermometer
M fermentation material

The invention claimed is:

1. An electronic component comprising:
a field effect transistor that functions as a source electrode and a drain electrode of an ion sensor;
a driving circuit that causes a potential difference between the source electrode and the drain electrode of the field effect transistor; and
a conductive diamond electrode, wherein
a reference electrode potential of the field effect transistor is fixed by the conductive diamond electrode, and
a surface of the conductive diamond electrode is fluorine-terminated.

2. The electronic component according to claim 1, wherein
the field effect transistor has a diamond thin film disposed on a surface of a substrate of the field effect transistor, and
the source electrode and the drain electrode are disposed on the diamond thin film.

3. The electronic component according to claim 1, wherein the field effect transistor is an Ion-Sensitive Field-Effect Transistor.

4. An ion sensor for measuring ion concentration of a measurement target liquid, based on an output from a reference electrode, a source electrode, and a drain electrode, comprising:
a field effect transistor that functions as the source electrode and the drain electrode;
a container that contains the field effect transistor and the measurement target liquid, wherein the container is fixed at a predetermined potential and functions as the reference electrode; and
a driving circuit that causes a potential difference between the source electrode and the drain electrode of the field effect transistor.

5. The ion sensor according to claim 4, wherein
the field effect transistor has a substrate and a diamond thin film disposed on the surface of the substrate of the field effect transistor, and
the source electrode and the drain electrode are disposed on the diamond thin film.

6. The ion sensor according to claim 5, wherein a vicinity of a surface of the diamond thin film is a p-type semiconductor.

7. The ion sensor according to claim 4, wherein a protective film is disposed on a surface of the source electrode and the drain electrode of the field effect transistor.

8. The ion sensor according to claim 4, wherein the field effect transistor is an Ion-Sensitive Field-Effect Transistor.

9. The ion sensor according to claim 4, wherein the field effect transistor is an Ion-Sensitive Field-Effect Transistor that comprises a silicon substrate.

10. The ion sensor according to claim 9, wherein a diamond thin film is disposed on a channel-side surface of the silicon substrate.

11. The ion sensor according to claim 4, wherein an inner wall surface of the container is coated with a conductive material.

12. The ion sensor according to claim 11, wherein the conductive material is made of at least one of metal, carbon, conductive diamond, and conductive diamond-like carbon.

13. The ion sensor according to claim 4, wherein the container comprises an insulating container and a conductive film made of a conductive material coated on an inner wall surface of the insulating container.

14. An ion concentration measurement method using the ion sensor according to claim 4, the ion concentration measurement method comprising:
immersing the field effect transistor in the measurement target liquid contained in the container;
generating a current between a source area and a drain area of the field effect transistor by electrochemically connecting a channel area of the field effect transistor to the container via the measurement target liquid while a potential difference is caused, by the driving circuit, between the source area and the drain area of the field effect transistor; and
measuring ion concentration in the measurement target liquid, based on the current.

15. The ion concentration measurement method according to claim 14, wherein a voltage applied to the drain area is 0V.

* * * * *